US 6,611,548 B2

(12) United States Patent
Lomp

(10) Patent No.: US 6,611,548 B2
(45) Date of Patent: *Aug. 26, 2003

(54) MULTIPATH PROCESSOR

(75) Inventor: Gary R. Lomp, Centerport, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/027,693

(22) Filed: Oct. 19, 2001

(65) Prior Publication Data

US 2002/0085624 A1 Jul. 4, 2002

Related U.S. Application Data

(63) Continuation of application No. 09/716,864, filed on Nov. 20, 2000, now Pat. No. 6,330,272, which is a continuation of application No. 09/277,400, filed on Mar. 26, 1999, now Pat. No. 6,175,586, which is a continuation of application No. 08/891,236, filed on Jul. 10, 1997, now Pat. No. 5,995,538, which is a division of application No. 08/743,379, filed on Nov. 4, 1996, now Pat. No. 5,835,527, which is a continuation of application No. 08/368,710, filed on Jan. 4, 1995, now Pat. No. 5,574,747.

(51) Int. Cl.$^7$ .......................... H04B 1/69; H04B 1/707; H04Q 7/00

(52) U.S. Cl. ....................... 375/148; 375/130; 375/370; 375/331

(58) Field of Search ................. 375/148, 130; 370/331

(56) References Cited

U.S. PATENT DOCUMENTS

| 3,571,767 A | 3/1971 | Bush |
| 3,838,342 A | 9/1974 | Bjorkman |
| 4,164,628 A | 8/1979 | Ward et al. |
| 4,189,677 A | 2/1980 | Cooper et al. |
| 4,193,031 A | 3/1980 | Cooper |
| 4,222,115 A | 9/1980 | Cooper et al. |

(List continued on next page.)

FOREIGN PATENT DOCUMENTS

| DE | 3730399 | 9/1989 | |
| EP | 0265178 | 4/1988 | |
| EP | 505771 A1 | 9/1992 | |
| EP | 0682417 | 11/1995 | |
| EP | 263687 A2 | 4/1998 | |
| GB | WO 94/27379 | * 11/1994 | ........... H04B/7/005 |
| WO | WO9221196 | 11/1992 | |
| WO | WO9307702 | 4/1993 | |
| WO | WO9310609 | 5/1993 | |
| WO | 9427379 | 11/1994 | |
| WO | 9430025 | 12/1994 | |

OTHER PUBLICATIONS

Szu–LinSu et al., Reverse–link Power Control Strategies for CDMA Cellular Network, IEEE International Symposium on Personal, Indoor and Mobile Radio Communications, XX, XX, vol. 2, 1995, pp. 461–465.

Primary Examiner—Mohammad H. Ghayour
Assistant Examiner—Tony Al-Beshrawi
(74) Attorney, Agent, or Firm—Volpe & Koenig, P.C.

(57) ABSTRACT

A multipath processor processes a plurality of groups of spread-spectrum signals. Each group has a plurality of spread-spectrum signals. A first plurality of spread-spectrum signals is despread within a first group to generate a first plurality of despread signals. The first plurality of despread signals are combined as a first combined-despread signal. A second plurality of spread-spectrum signals is despread within a second group to generate a second plurality of despread signals. The second plurality of despread signals are combined as a second combined-despread signal. The first and second combined-despread signal are combined as an output-despread signal.

4 Claims, 23 Drawing Sheets

U.S. PATENT DOCUMENTS

| | | | |
|---|---|---|---|
| 4,253,067 A | * 2/1981 | Caples et al. | 329/306 |
| 4,349,915 A | 9/1982 | Costas | |
| 4,426,630 A | 1/1984 | Folkmann | |
| 4,621,365 A | 11/1986 | Chiu | |
| 4,641,322 A | 2/1987 | Hasegawa | |
| 4,653,069 A | 3/1987 | Roeder | |
| 4,694,467 A | 9/1987 | Mui | |
| 4,697,260 A | 9/1987 | Grauel et al. | |
| 4,765,753 A | 8/1988 | Schmidt | |
| 4,965,539 A | 10/1990 | Korber, Jr. | |
| 4,984,247 A | 1/1991 | Kaufmann et al. | |
| 5,056,109 A | 10/1991 | Gilhousen et al. | |
| 5,077,753 A | 12/1991 | Grau, Jr. et al. | |
| 5,081,643 A | 1/1992 | Schilling | |
| 5,093,840 A | 3/1992 | Schilling | |
| 5,101,501 A | 3/1992 | Gilhousen et al. | |
| 5,103,459 A | * 4/1992 | Gilhousen et al. | 370/206 |
| 5,109,390 A | 4/1992 | Gilhousen et al. | |
| 5,161,168 A | 11/1992 | Schilling | |
| 5,170,410 A | 12/1992 | Gressier et al. | |
| 5,179,571 A | * 1/1993 | Schilling | 370/331 |
| 5,179,572 A | 1/1993 | Schilling | |
| 5,180,999 A | 1/1993 | Edwards | |
| 5,218,618 A | 6/1993 | Sagey | |
| 5,224,120 A | 6/1993 | Schilling | |
| 5,228,056 A | 7/1993 | Schilling | |
| 5,233,626 A | 8/1993 | Ames | |
| 5,257,283 A | 10/1993 | Gilhousen et al. | |
| 5,265,119 A | 11/1993 | Gilhousen et al. | |
| 5,267,262 A | 11/1993 | Wheatley, III | |
| 5,291,516 A | 3/1994 | Dixon et al. | |
| 5,299,226 A | 3/1994 | Schilling | |
| 5,305,348 A | 4/1994 | Izumi | |
| 5,305,349 A | 4/1994 | Dent | |
| 5,305,468 A | 4/1994 | Bruckert et al. | |
| 5,321,721 A | 6/1994 | Yamaura et al. | |
| 5,343,496 A | * 8/1994 | Honig et al. | 370/342 |
| 5,363,403 A | 11/1994 | Schilling et al. | |
| 5,386,588 A | 1/1995 | Yasuda | |
| 5,438,329 A | 8/1995 | Gastouniotis et al. | |
| 5,448,600 A | * 9/1995 | Lucas | 375/205 |
| 5,485,486 A | 1/1996 | Gilhousen et al. | |
| 5,487,083 A | 1/1996 | Nakajima et al. | |
| 5,535,238 A | 7/1996 | Schilling et al. | |
| 5,574,747 A | 11/1996 | Lomp | |
| 5,631,921 A | 5/1997 | Schilling | |
| 5,659,572 A | 8/1997 | Schilling | |
| 5,673,286 A | * 9/1997 | Lomp | 375/208 |
| 5,694,388 A | 12/1997 | Sawahashi et al. | |
| 5,757,847 A | * 5/1998 | Durrant et al. | 375/206 |
| 5,799,004 A | * 8/1998 | Keskitalo et al. | 370/335 |
| 5,809,020 A | 9/1998 | Bruckert et al. | |
| 5,835,527 A | 11/1998 | Lomp | |
| 5,995,538 A | * 11/1999 | Lomp | 375/208 |
| 6,226,316 B1 | 5/2001 | Schilling et al. | |

* cited by examiner

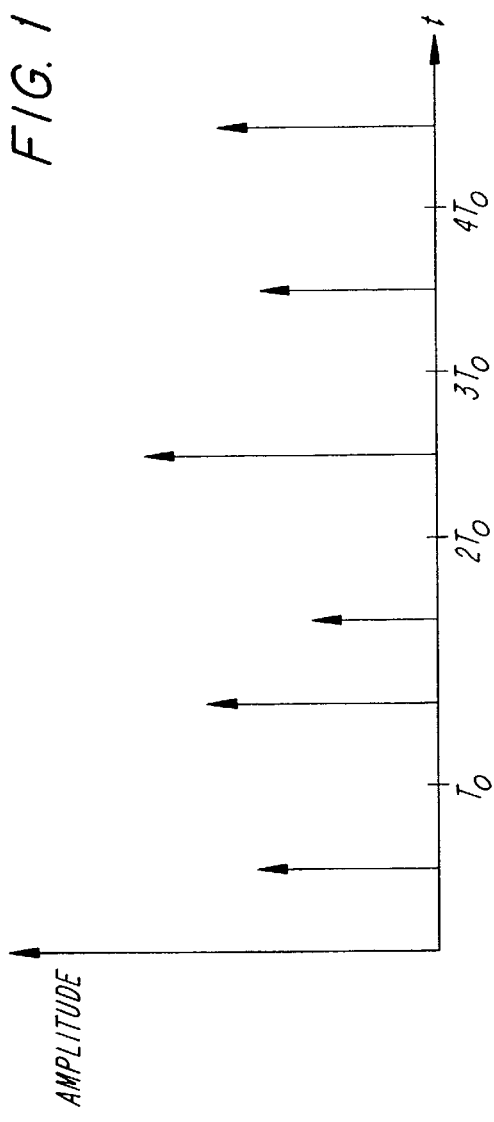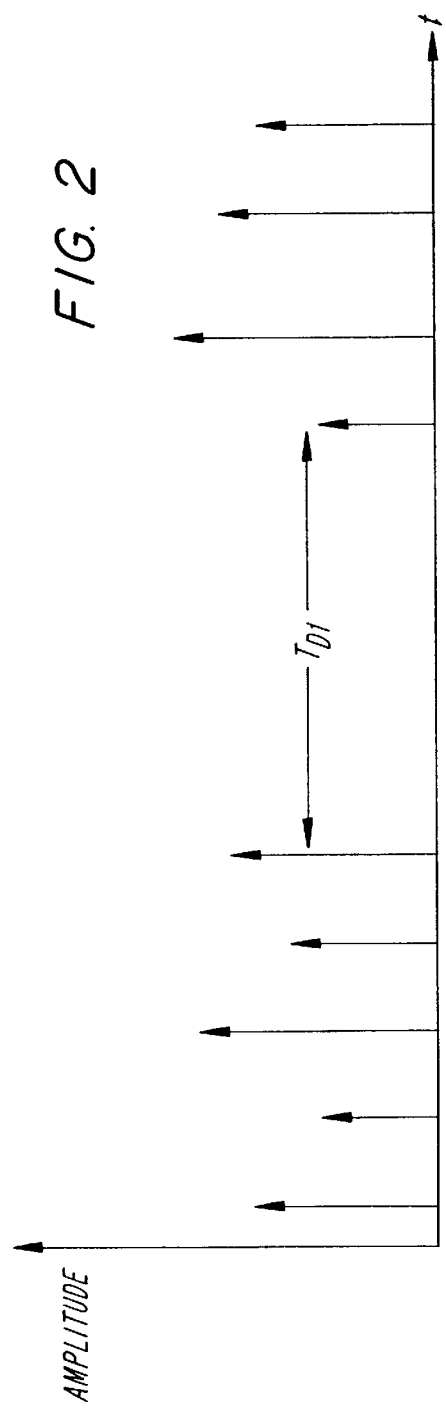

MULTIPATH PROCESSOR

This patent is a continuation of U.S. patent application Ser. No. 09/716,864, filed Nov. 20, 2000, now U.S. Pat. No. 6,230,272 which issued on Dec. 11, 2002, which is a continuation of U.S. patent application Ser. No. 09/277,400, filed Mar. 26, 1999, which issued on Jan. 16, 2001 as U.S. Pat. No. 6,175,586, which is a continuation of U.S. patent application Ser. No. 08/891,236, filed Jul. 10, 1997, which issued on Nov. 30, 1999 as U.S. Pat. No. 5,995,538, which is a divisional of U.S. patent application Ser No. 08/743,379, filed Nov. 4, 1996, which issued on Nov. 10, 1998 as U.S. Pat. No. 5,835,527, which is a continuation of U.S. patent application Ser. No. 08/368,710, filed Jan. 4, 1995, which issued on Nov. 12, 1996 as U.S. Pat. No. 5,574,747.

BACKGROUND

This invention relates to spread-spectrum communications, and more particularly to a multipath processor, variable bandwidth device, and power control system.

Spread-spectrum modulation provides means for communicating in which a spread-spectrum signal occupies a bandwidth in excess of the minimum bandwidth necessary to send the same information. The band spread is accomplished by modulating an information-data signal with a chipping-sequence signal which is independent of an information-data signal. The information-data signal may come from a data device such as a computer, or an analog device which outputs an analog signal which has been digitized to an information-data signal, such as voice or video. The chipping-sequence signal is generated by a chip-code where the time duration, $T_c$, of each chip is substantially less than a data bit or data symbol. A synchronized reception of the information-data signal with the chipping-sequence signal at a receiver is used for despreading the spread-spectrum signal and subsequent recovery of data from the spread-spectrum signal.

Spread-spectrum modulation offers many advantages as a communications system for an office or urban environment. These advantages include reducing intentional and unintentional interference, combating multipath problems, and providing multiple access to a communications system shared by multiple users. Commercially, these applications include, but are not limited to, local area networks for computers and personal communications networks for telephone, as well as other data applications.

A cellular communications network, using spread-spectrum modulation for communicating between a base station and a multiplicity of users, requires control of the power level of a particular mobile user station. Within a particular cell, a mobile station near the base station of the cell may be required to transmit with a power level less than that required when the mobile station is near an outer perimeter of the cell. This adjustment in power level is done to ensure a constant power level is received at the base station from each mobile station.

In a first geographical region, such as an urban environment, the cellular architecture may have small cells in which the respective base stations are close to each other, requiring a low power level from each mobile user. In a second geographical region, such as a rural environment, the cellular architecture may have large cells in which the respective base stations are spread apart, requiring a relatively high power level from each mobile user. A mobile user who moves from the first geographical region to the second geographical region typically adjusts the power level of his transmitter in order to meet the requirements of a particular geographic region. If such adjustments were not made, a mobile user traveling from a sparsely populated region with larger cells, using the relatively higher power level with his spread-spectrum transmitter, to a densely populated region with many small cells may, without reducing the original power level of his spread-spectrum transmitter, cause undesirable interference within the smaller cell into which he has traveled and/or to adjacent cells. Also, if a mobile user moves behind a building and has his signal to the base station blocked by the building, then the mobile user's power level should be increased. These adjustments must be made quickly, with high dynamic range and in a manner to ensure an almost constant received power level with low root mean square error and peak deviations from the constant level.

Accordingly, there is a need to have a spread-spectrum system and method for automatically controlling a mobile user's spread-spectrum transmitter power level when operating in a cellular communications network.

SUMMARY

A multipath processor processes a plurality of groups of spread-spectrum signals. Each group has a plurality of spread-spectrum signals. A first plurality of spread-spectrum signals is despread within a first group to generate a first plurality of despread signals. The first plurality of despread signals are combined as a first combined-despread signal. A second plurality of spread-spectrum signals is despread within a second group to generate a second plurality of despread signals. The second plurality of despread signals are combined as a second combined-despread signal. The first and second combined-despread signal are combined as an output-despread signal.

BRIEF DESCRIPTION OF THE DRAWING(S)

The accompanying drawings, which are incorporated in and constitute a part of the specification, illustrate preferred embodiments of the invention, and together with the description serve to explain the principles of the invention.

FIG. 1 illustrates channel impulse response giving rise to several multipath signals;

FIG. 2 illustrates conditions leading to two groups of several multipath signals;

Figure 5:
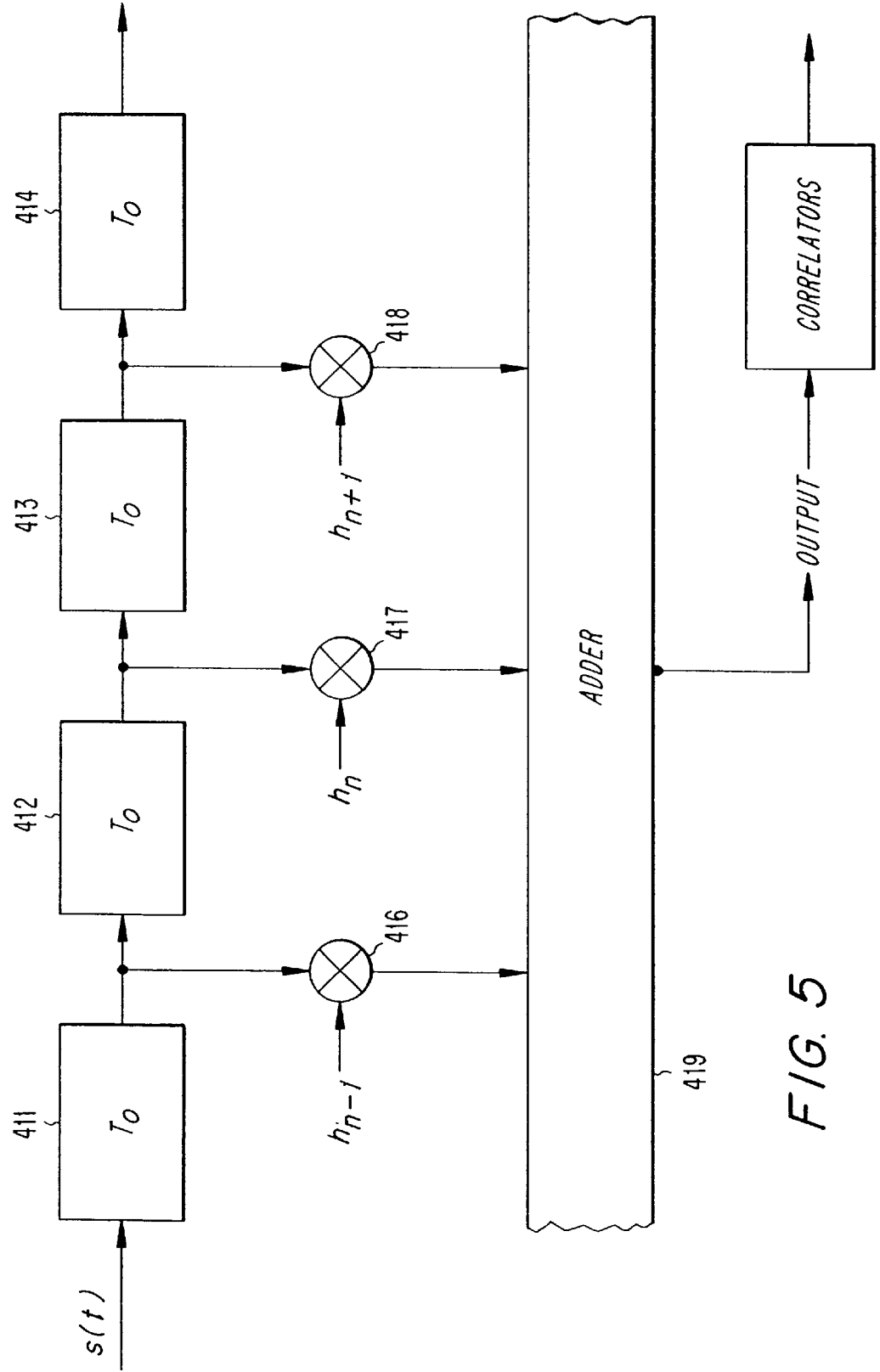
Figure 6:
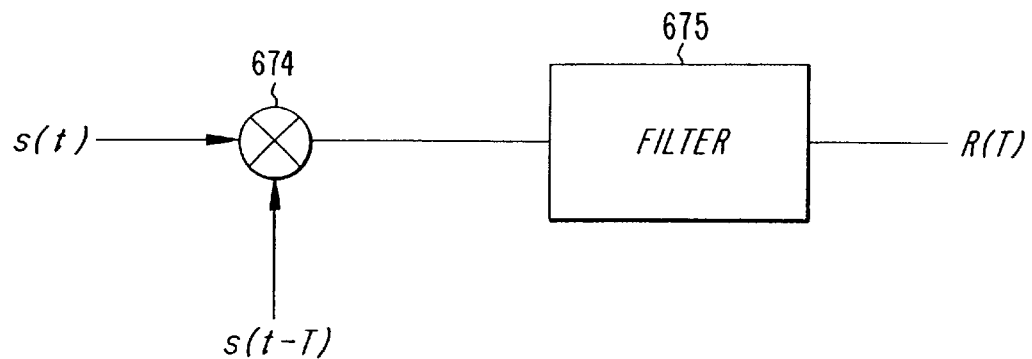
Figure 7:
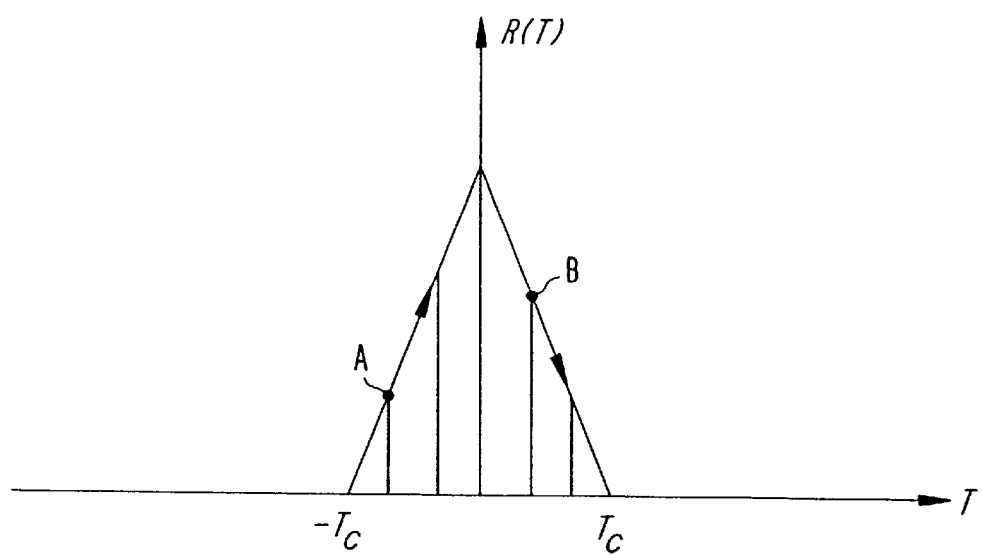
Figure 8:
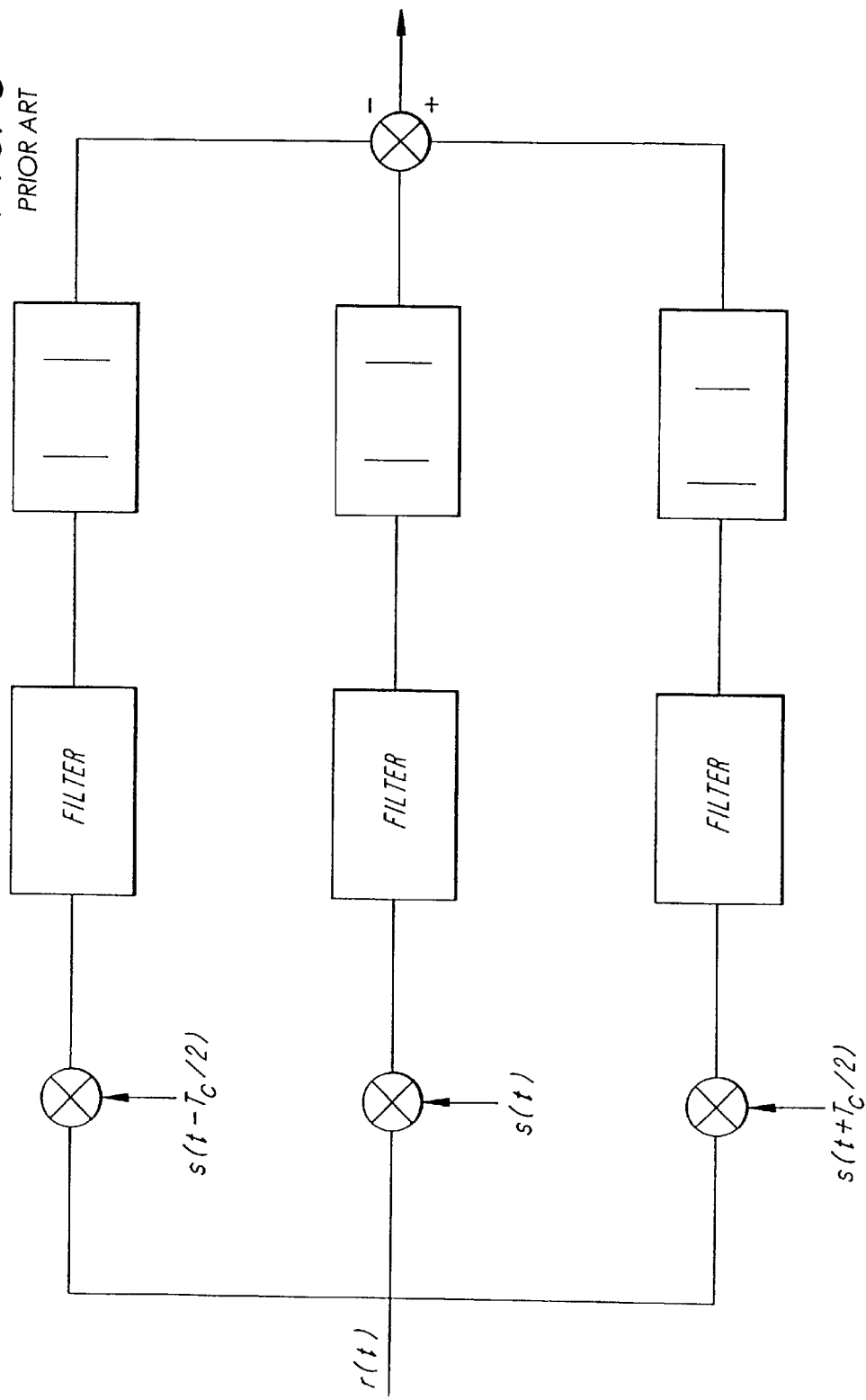
Figure 9:
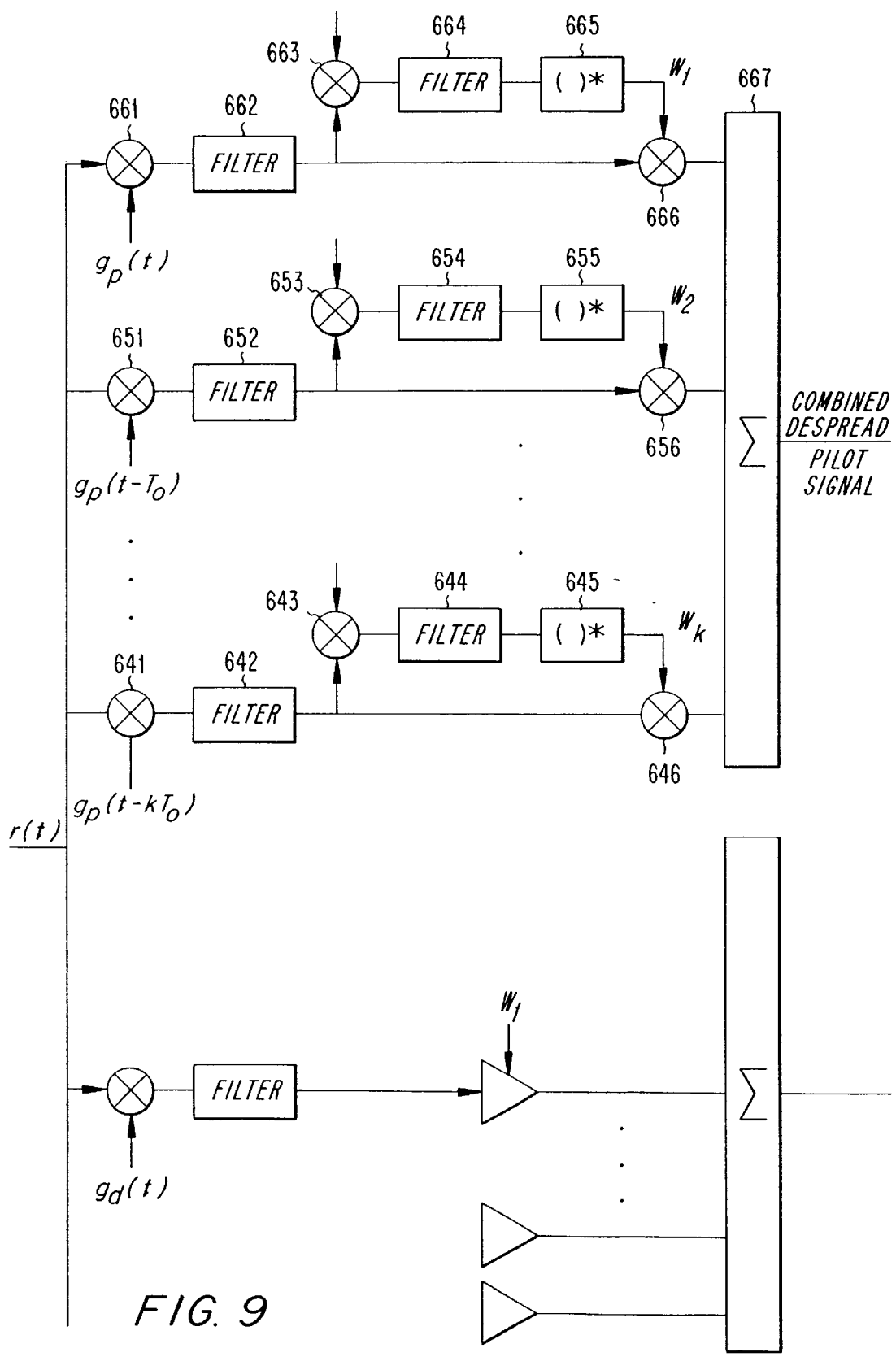
Figure 10:
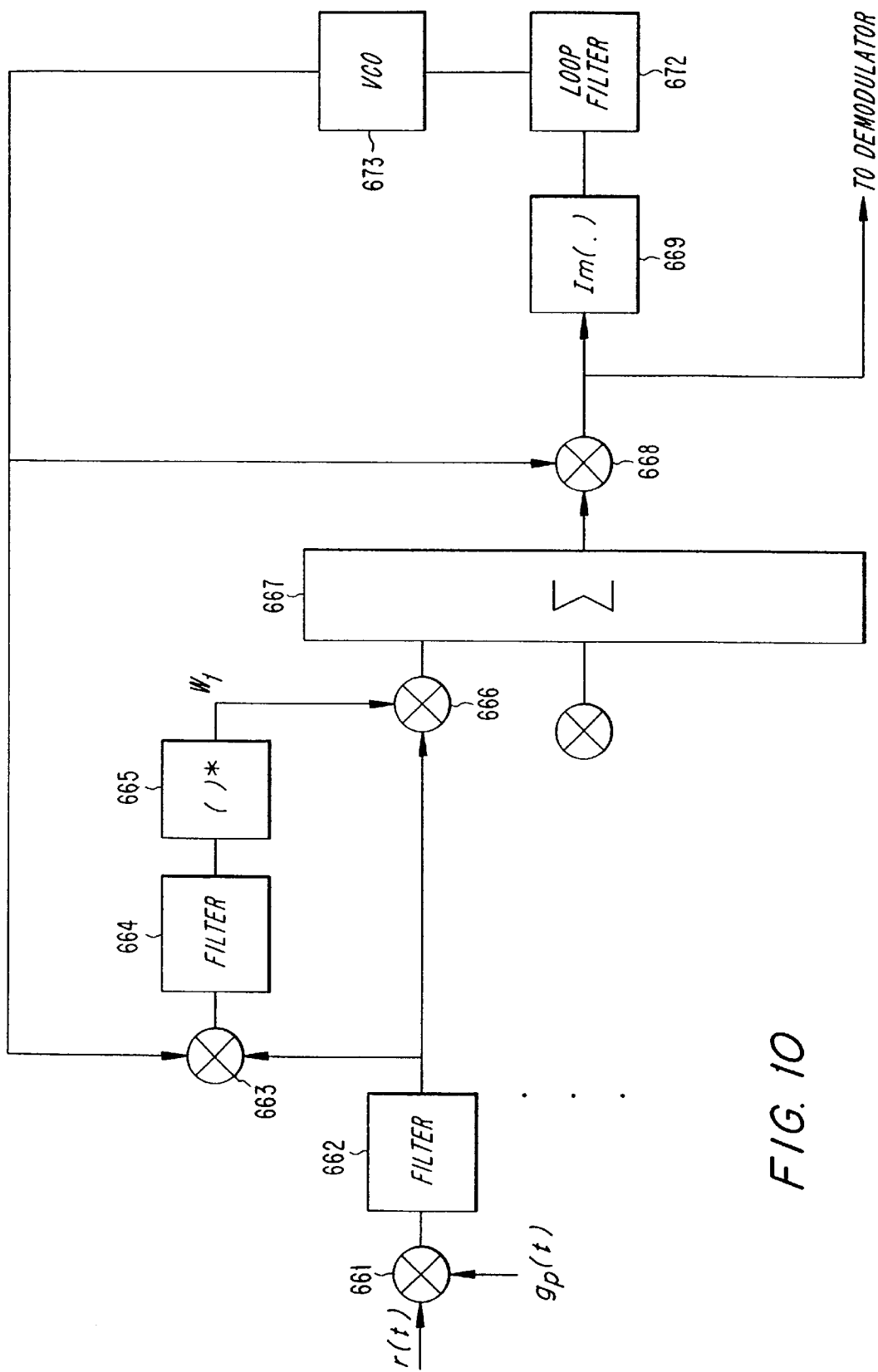
Figure 11:
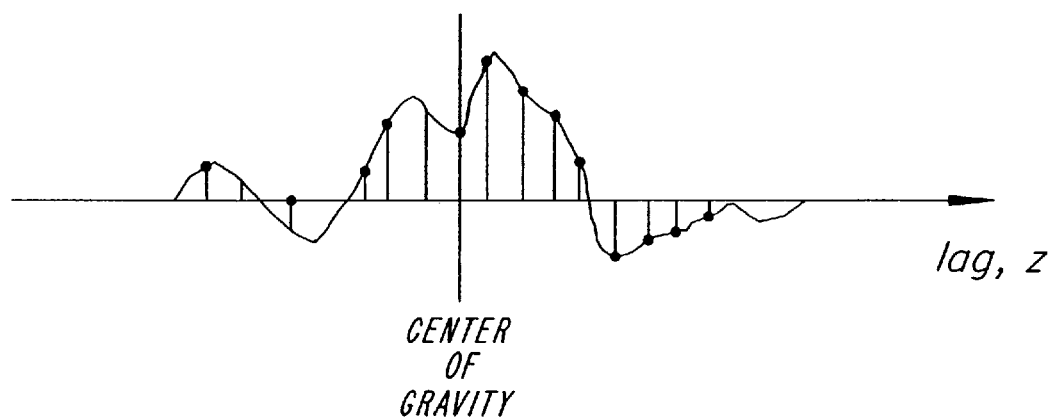
Figure 12:
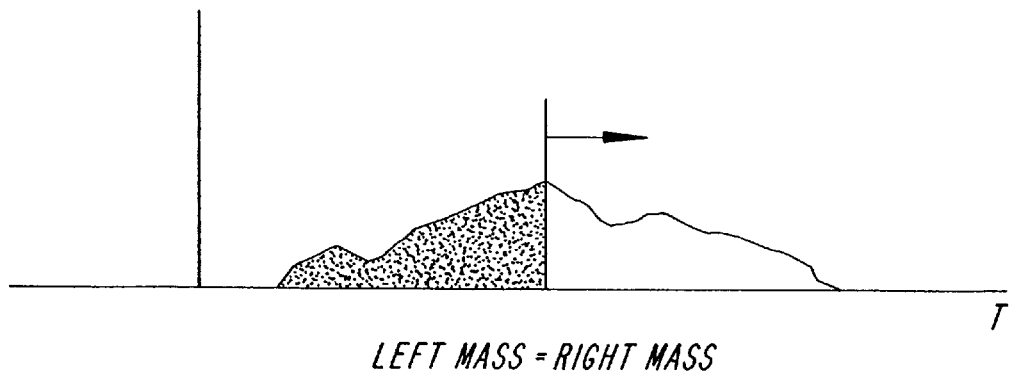
Figure 13:
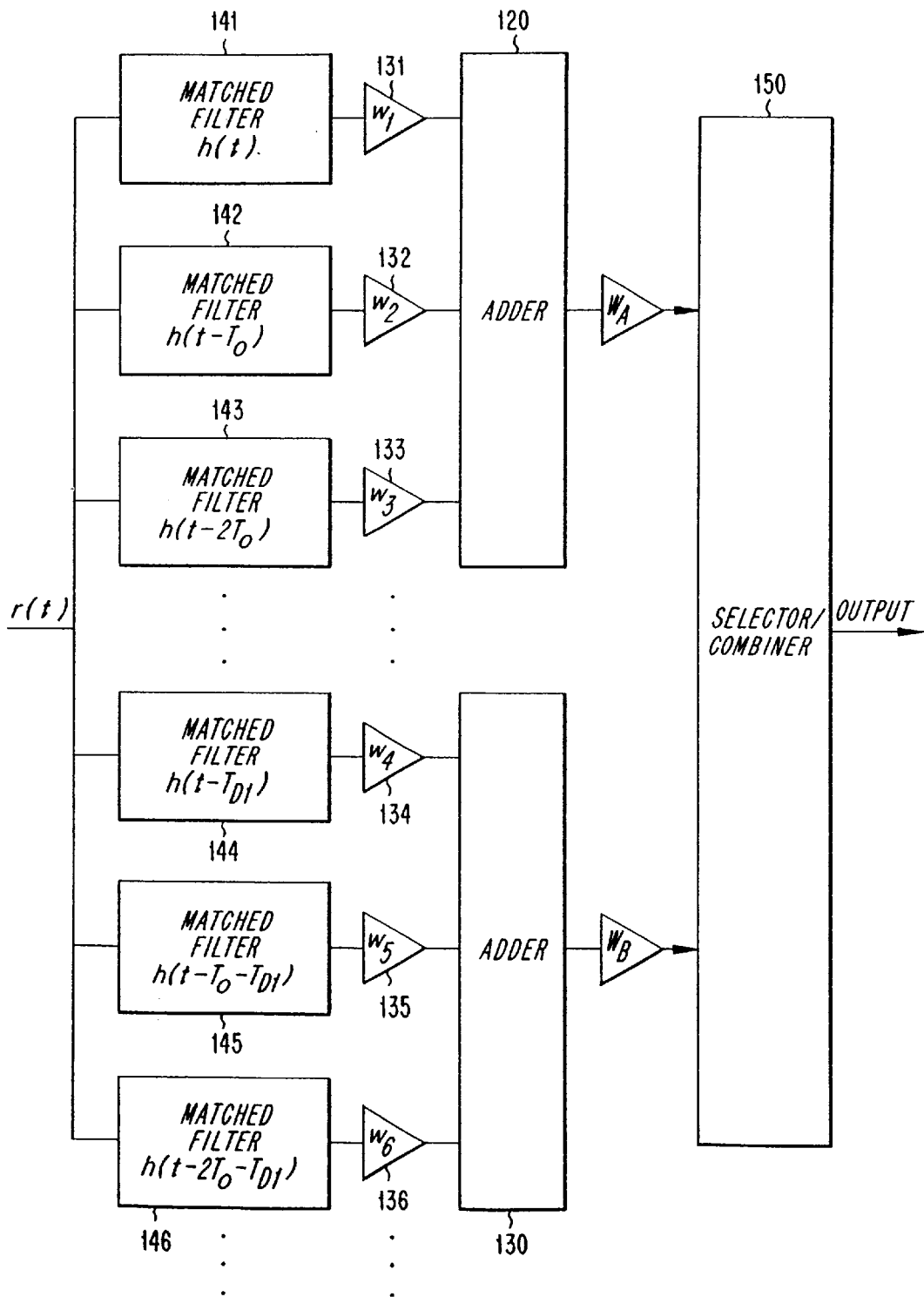
Figure 14:
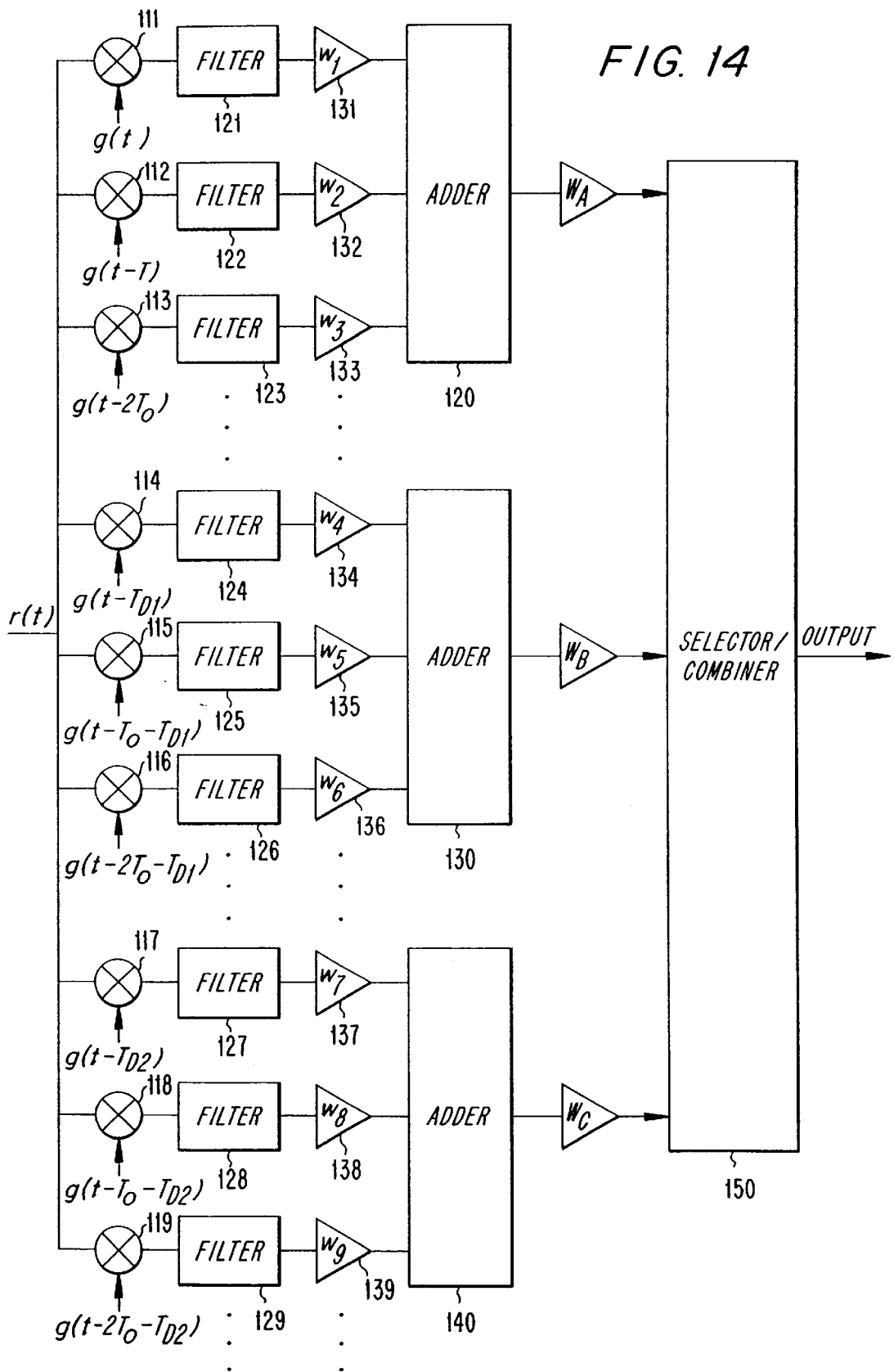
Figure 15:
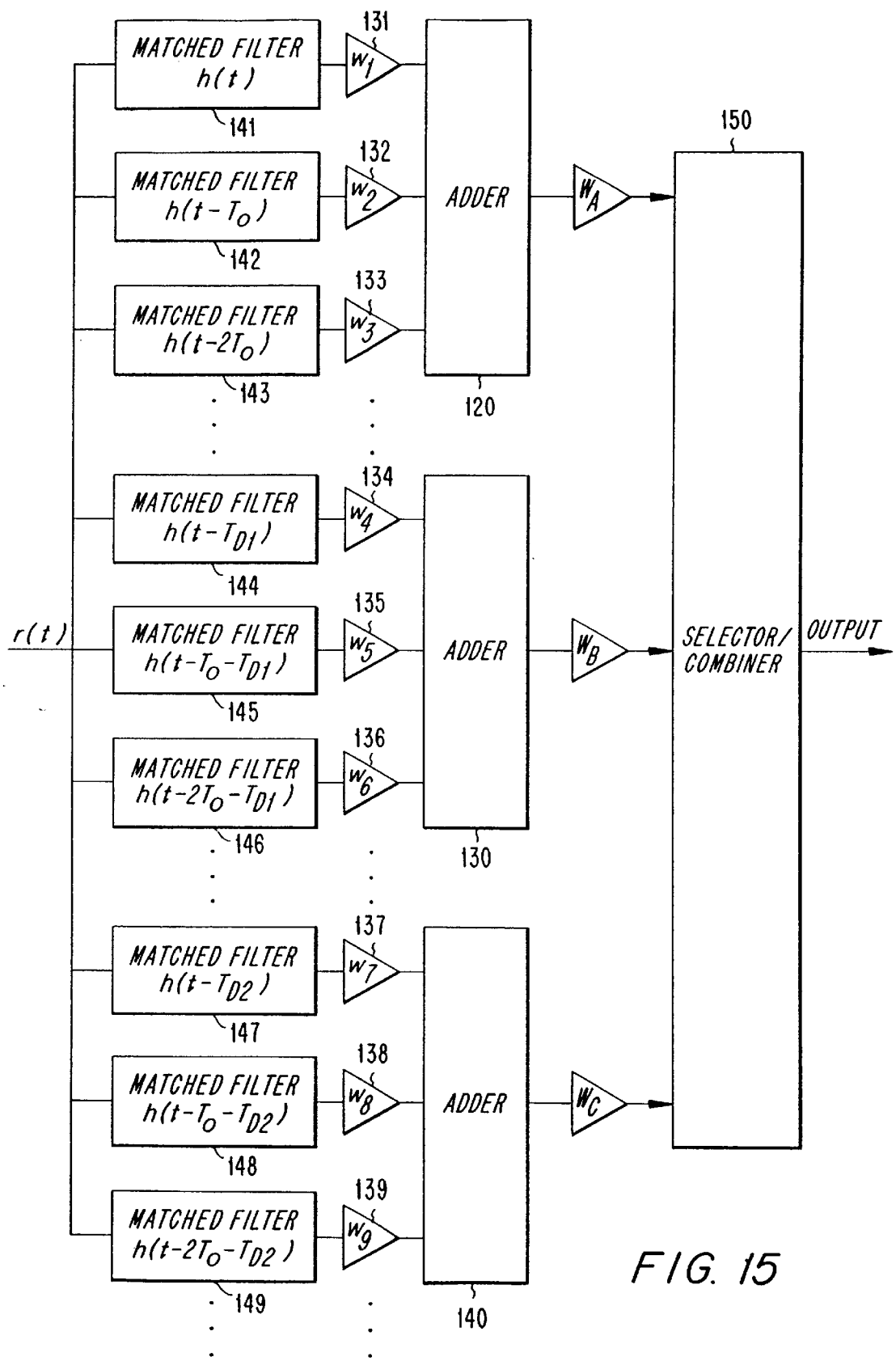
Figure 16:
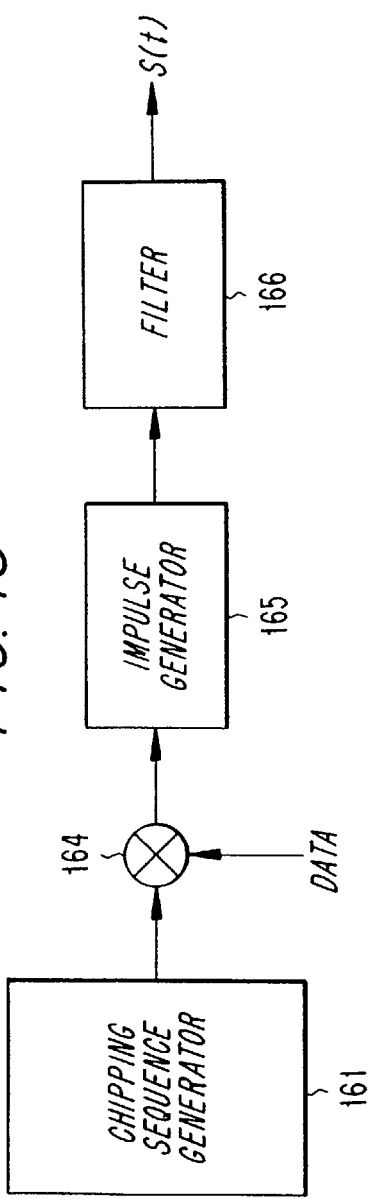
Figure 17:
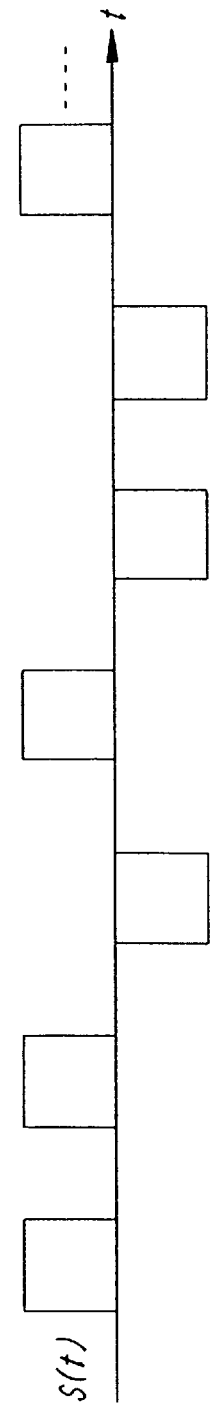
Figure 18:
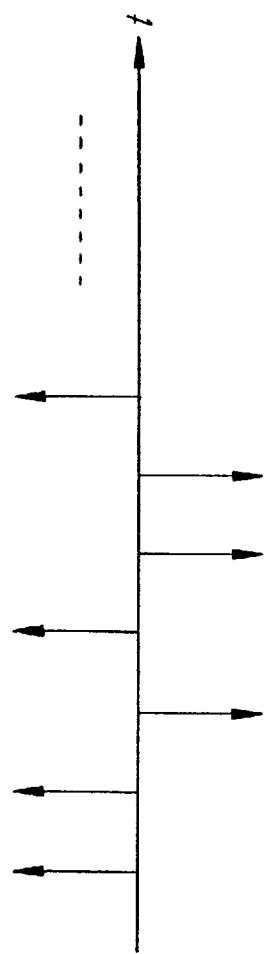
Figure 19:
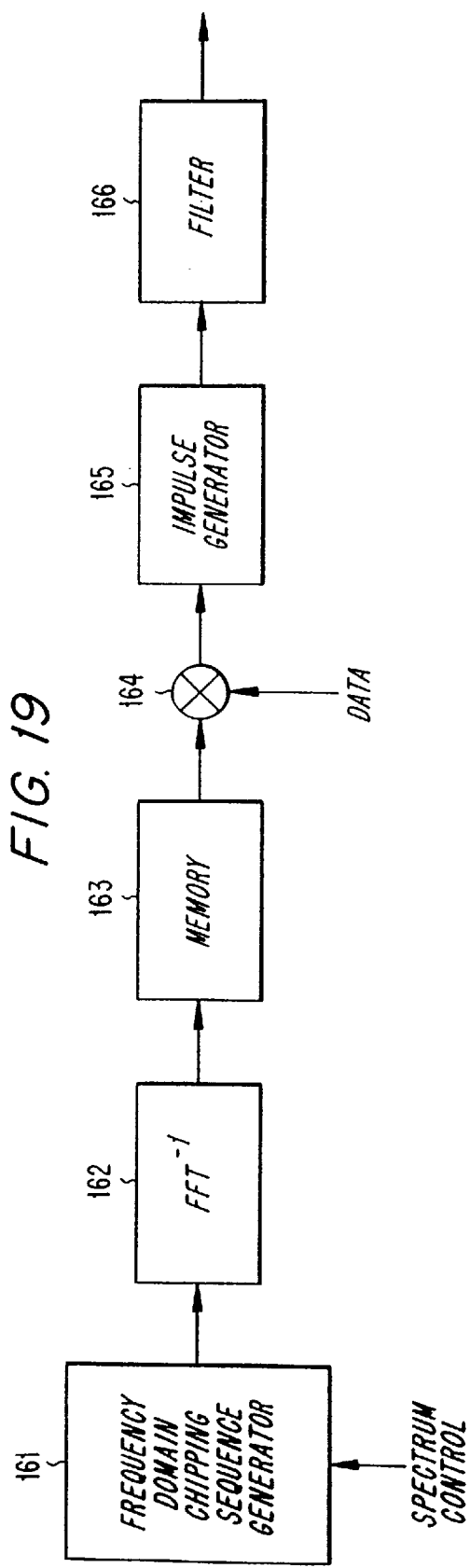
Figure 20:
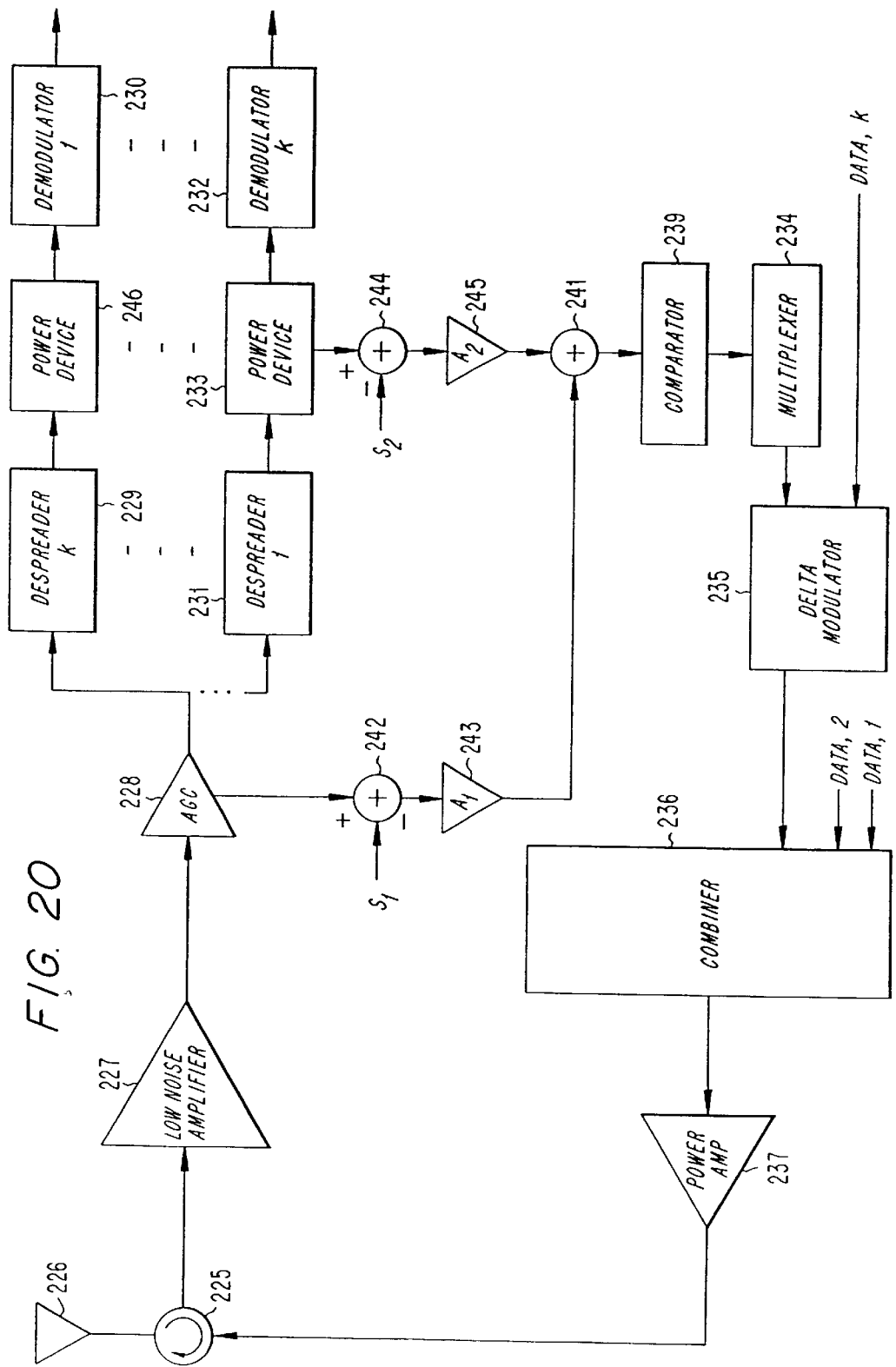
Figure 21:
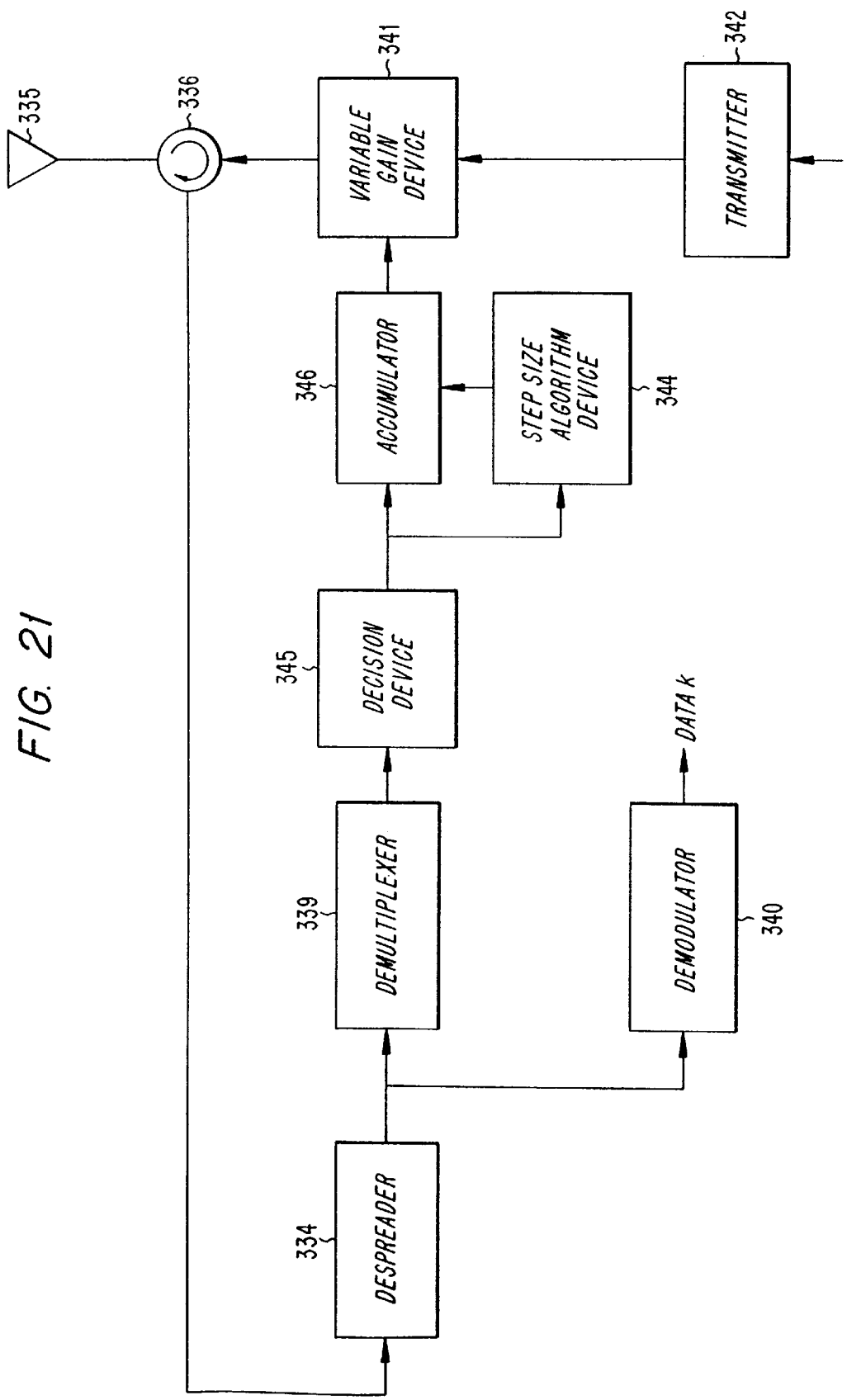
Figure 22:
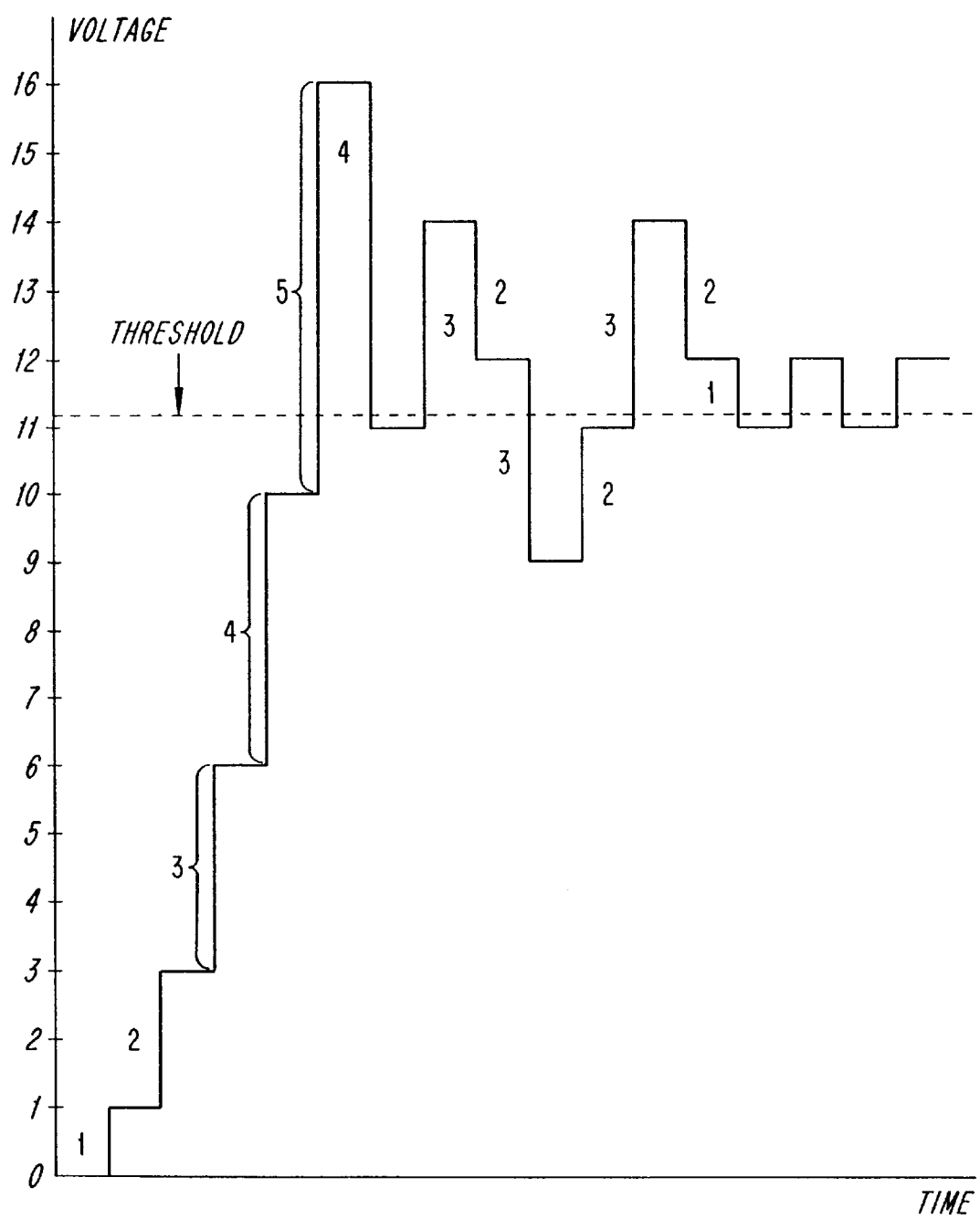
Figure 23:
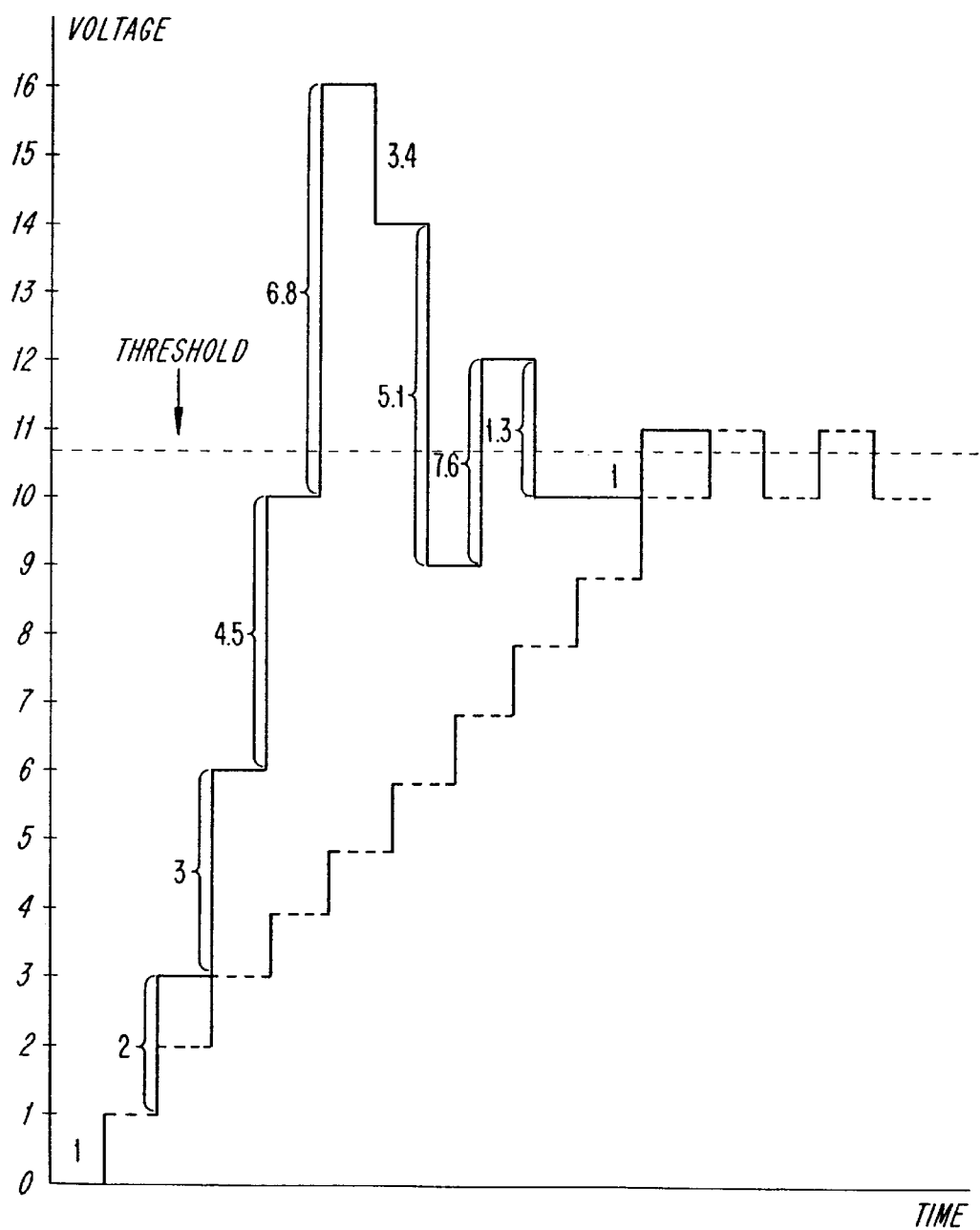
Figure 24:
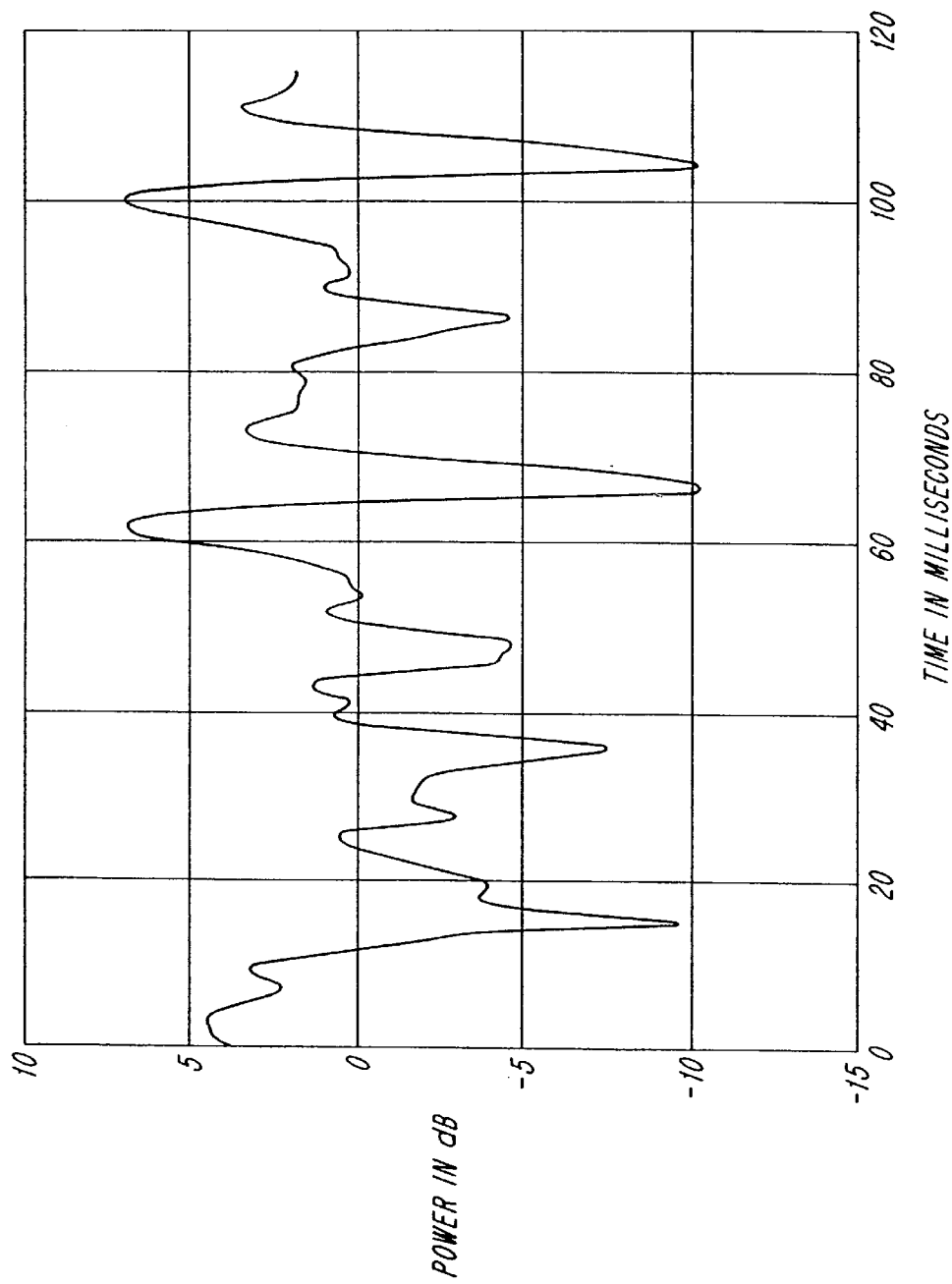
Figure 25:
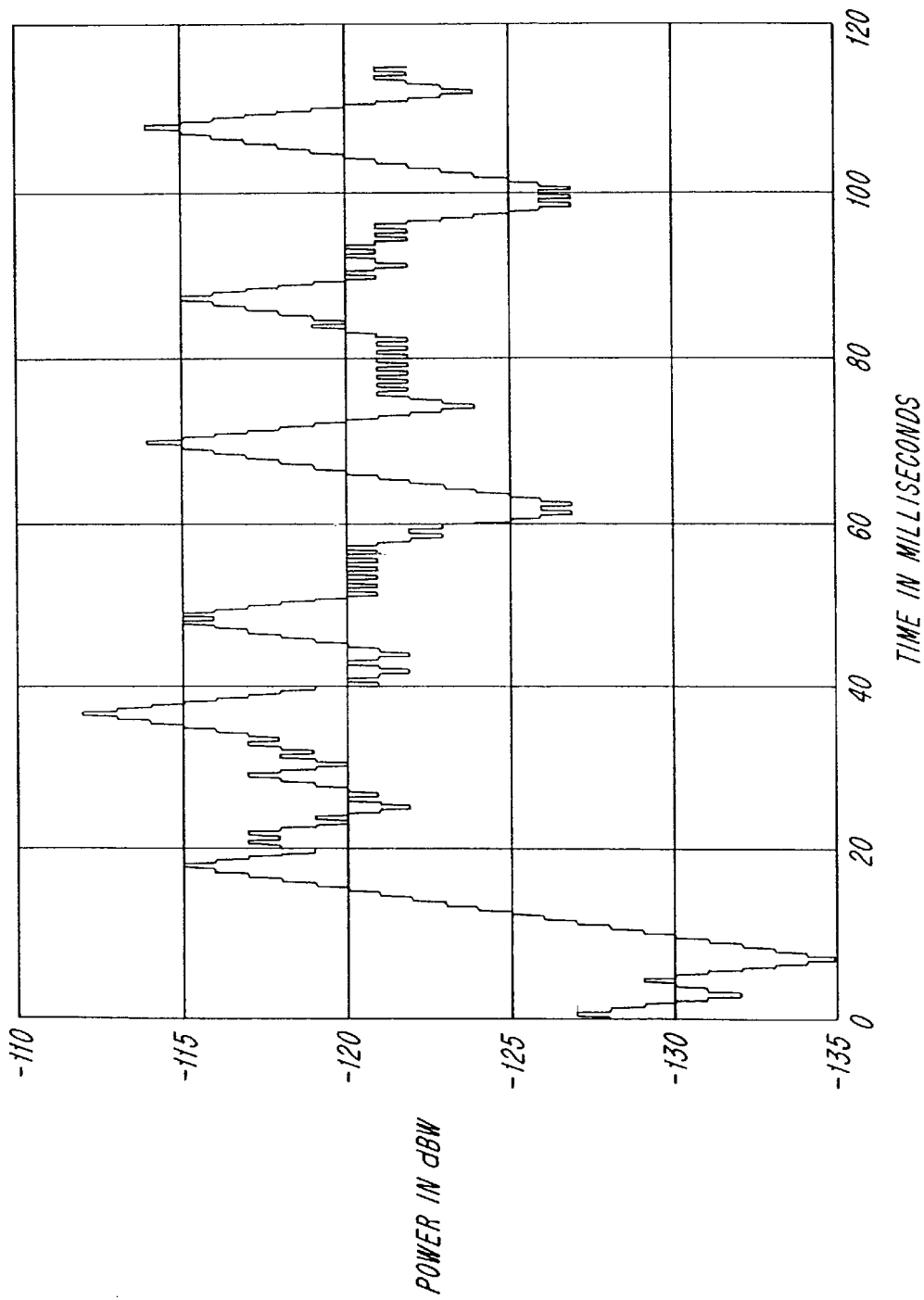
Figure 26:
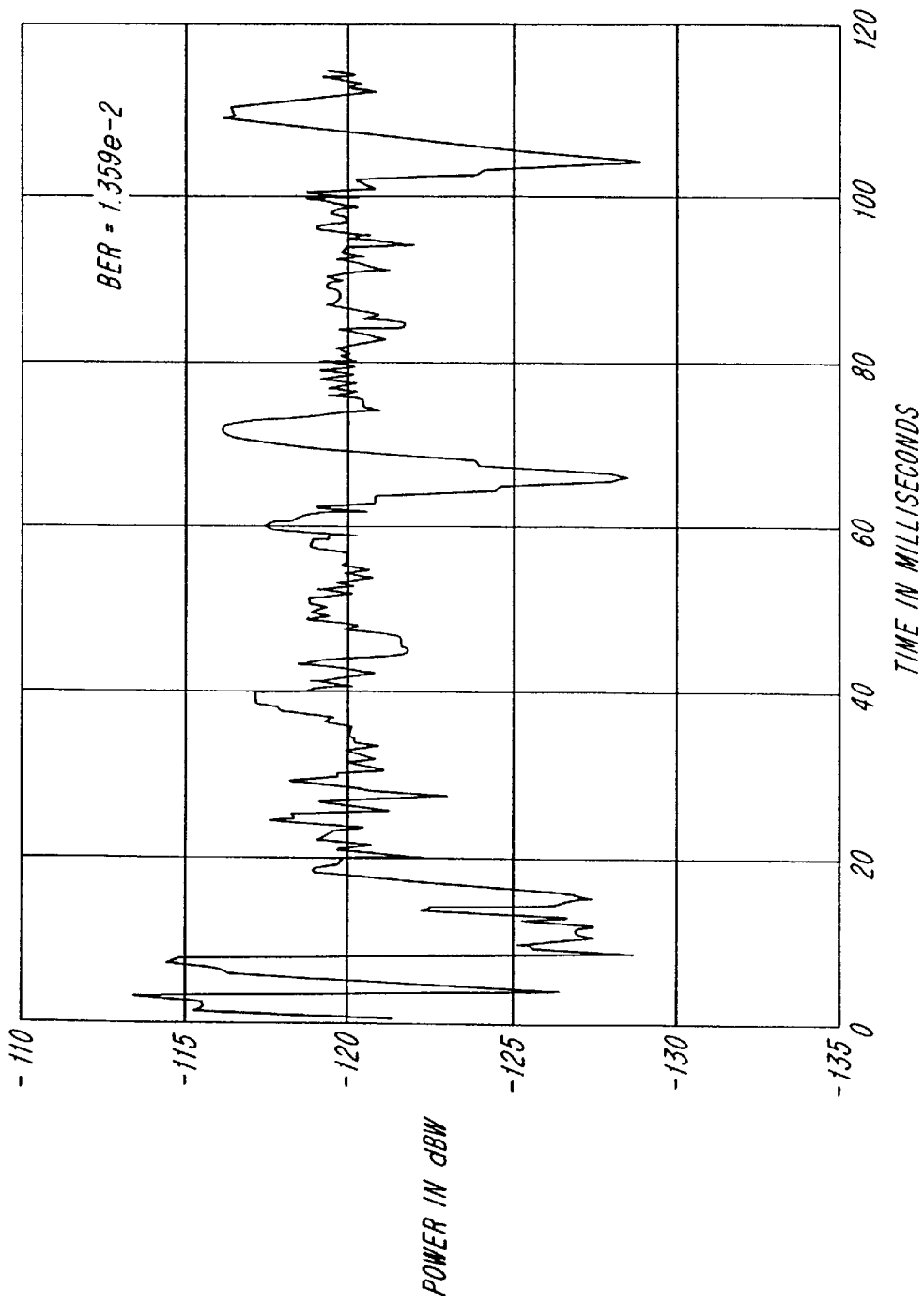
Figure 27:
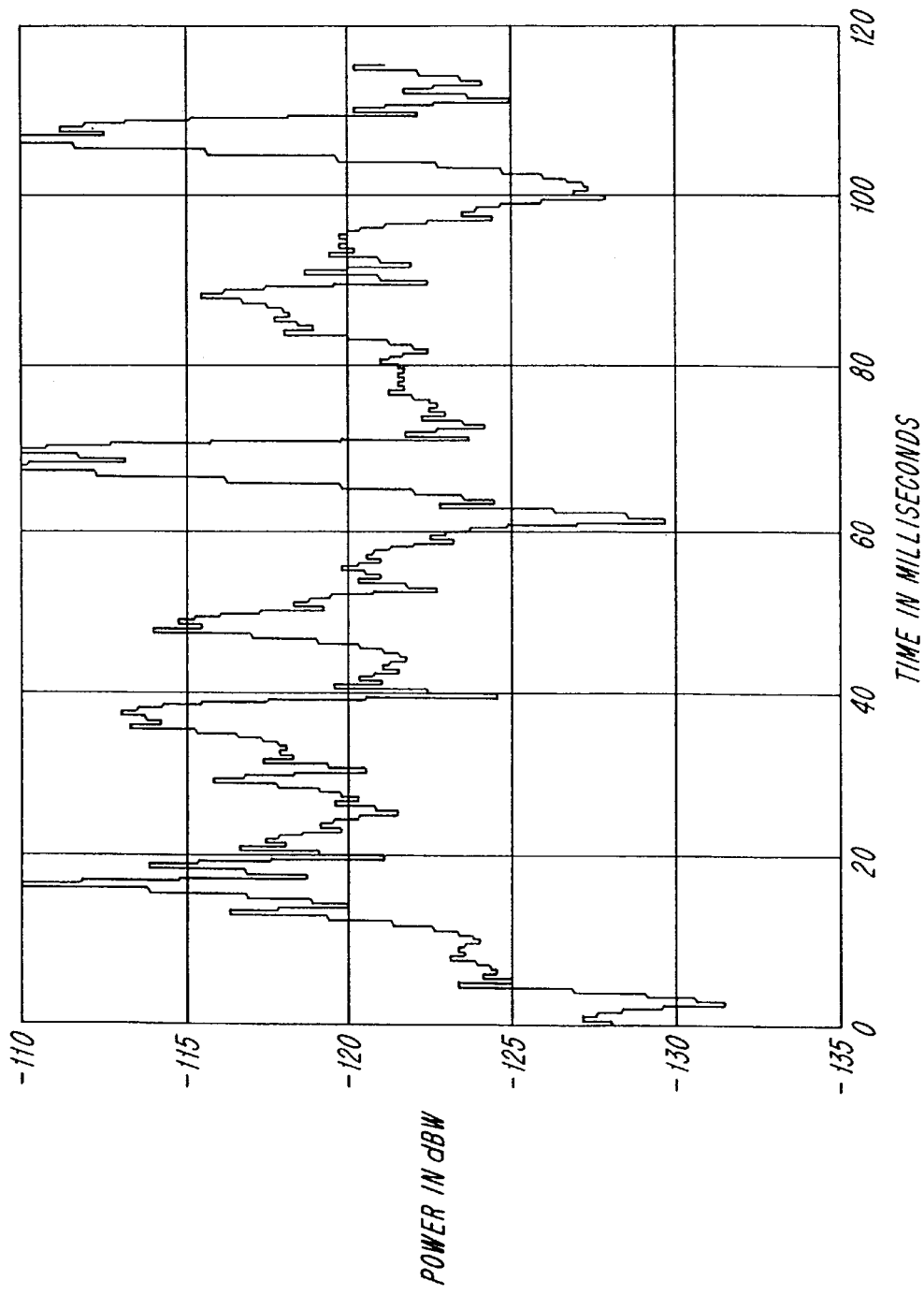
Figure 28:
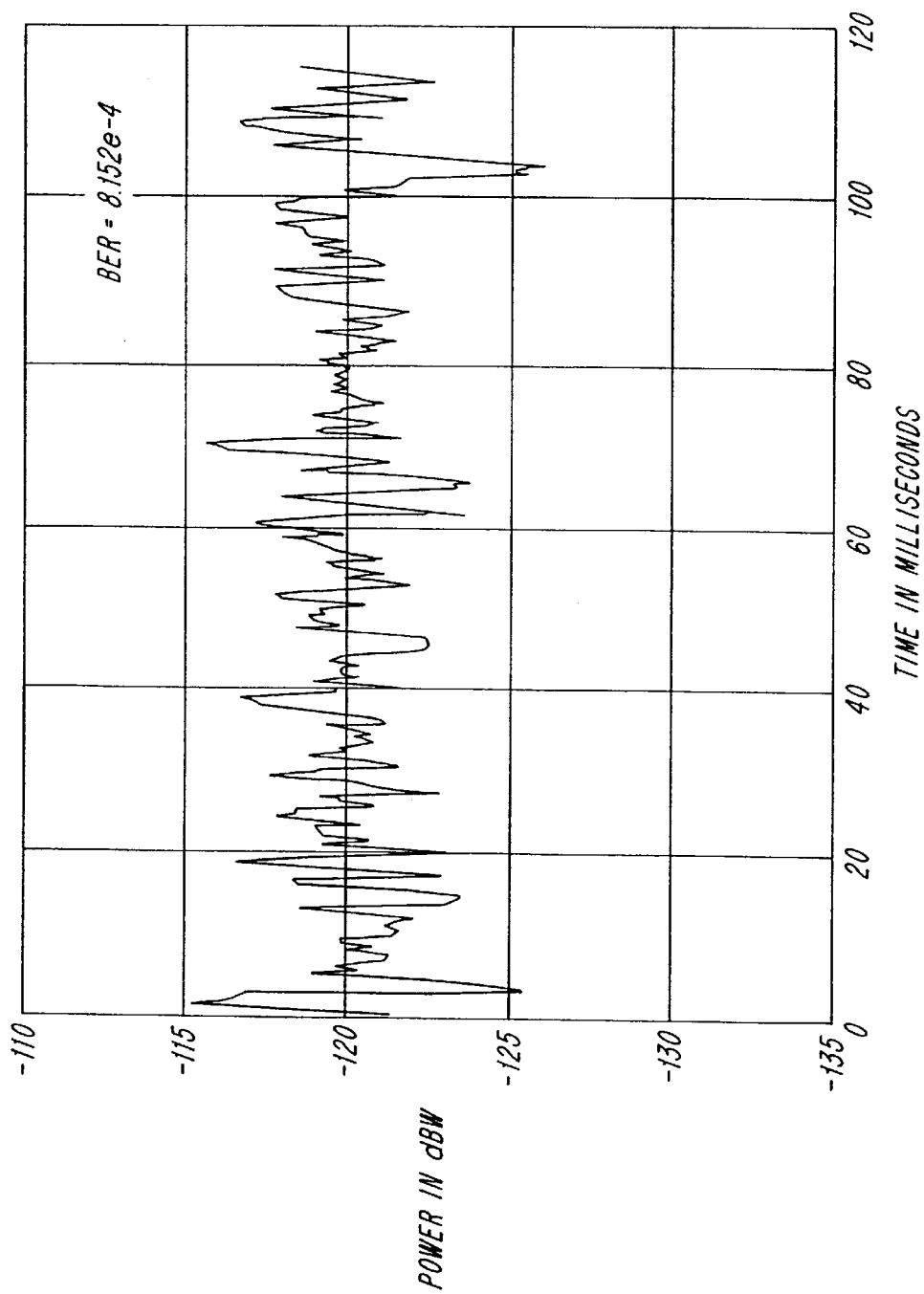

FIG. 5. is a tapped-delay line model of a communications channel;

FIG. 6 is a block diagram of a correlator;

FIG. 7 is an auto correlation function diagram generated from the correlator of FIG. 6;

FIG. 8 is a block diagram for tracking a received signal;

FIG. 9 is a block diagram for combining a pilot signal from a received spread-spectrum signal;

FIG. 10 is a block diagram for tracking a pilot signal embedded in a pilot channel of a spread-spectrum signal;

FIG. 11 illustrates cross-correlation between a received signal and a referenced chipping-sequence signal, as a function of referenced delay;

FIG. 12 illustrates the center of gravity of the cross-correlation function of FIG. 11;

FIG. 13 is a block diagram of a multipath processor using two sets of matched filters for despreading a spread-spectrum signal received as two groups of spread-spectrum signals;

FIG. 14 is a block diagram of a multipath processor using three sets of correlators for despreading a spread-spectrum signal received as three groups of spread-spectrum signals;

FIG. 15 is a block diagram of a multipath processor using three sets of matched filters for despreading a spread-spectrum signal received as three groups of spread-spectrum signals;

FIG. 16 is a block diagram of a variable-bandwidth spread-spectrum device;

FIG. 17 illustrates chips of a spread-data signal;

FIG. 18 illustrates impulse signals corresponding to the chips of the spread-data signal of FIG. 17;

FIG. 19 is an alternative block diagram of the variable-bandwidth spread-spectrum device of FIG. 16;

FIG. 20 is a block diagram of a base station;

FIG. 21 is a block diagram of a mobile station;

FIG. 22 illustrates nonlinear power adjustment;

FIG. 23 illustrates linear and nonlinear cower adjustment;

FIG. 24 illustrates fades during transmission for multiple signals or equivalent power received at a base station;

FIG. 25 illustrates an adaptive power control signal of broadcast power for a fixed step algorithm;

FIG. 26 illustrates despread output power for a fixed step algorithm;

FIG. 27 illustrates an adaptive power control signal of broadcast power for a variable step algorithm; and FIG. 28 illustrates despread output power for a variable step algorithm.

DETAILED DESCRIPTION OF THE PREFERRED EMBODIMENT(S)

Reference now is made in detail to the present preferred embodiments of the invention, examples of which are illustrated in the accompanying drawings, wherein like reference numerals indicate like elements throughout the several views.

Multipath Processor

In a multipath environment, a signal reflects from several buildings or other structures. The multiple reflections from the several buildings can result in several signals, or several groups of signals, arriving at a receiver. FIG. 1 illustrates a signal arriving in time as several signals. FIG. 2 illustrates a signal arriving in time as two groups of several signals. The multiple signals arriving at the receiver usually do not arrive with a uniform spread over time. Thus, in a multipath environment, a received signal r(t) may include two or more groups of spread-spectrum signals.

In the multipath environment, a spread-spectrum signal is assumed to generate a plurality of groups of spread-spectrum signals, with each group having a plurality of spread-spectrum signals. The plurality of groups is the result of the spread-spectrum signal reflecting in a multipath environment. As a means of responding to and dealing with this plurality of groups, the multipath processor is an improvement to a spread-spectrum receiver system. In the exemplary arrangement shown in FIG. 3, a multipath processor for tracking a spread-spectrum signal is shown. The multipath processor is used as part of a spread-spectrum receiver system.

The multipath processor includes first despreading means, second despreading means, first combining means, second combining means, and selecting means or output-combining means. The first combining means is coupled between the first despreading means and the selecting means or the output-combining signal. The second combining means is coupled between the second despreading means and the selecting means or the output-combining means.

The first despreading means despreads a received signal having a first plurality of spread-spectrum signals within a first group. The first despreading means thus generates a first plurality of despread signals. The first combining means combines, or adds together, the first plurality of despread signals to generate a first combined-despread signal.

The second despreading means despreads the received signal having a second plurality of spread-spectrum signals within a second group. The second despreading means thereby generates a second plurality of despread signals. The second combining means combines, or adds together, the second plurality of despread signals as a second combined-despread signal.

The selecting means selects either the first combined-despread signal or the second combined-despread signal. The selected combined-despread signal is outputted from the selecting means as an output-despread signal. The selecting means may operate responsive to the stronger signal strength of the first combined-despread signal and the second combined-despread signal, least mean square error, a maximum likelihood, or other selection criteria. Alternatively, using output-combining means in place of selecting means, the outputs of the first combining means and the second combining means may be coherently combined or added together, after suitable weighting.

Figure 3:
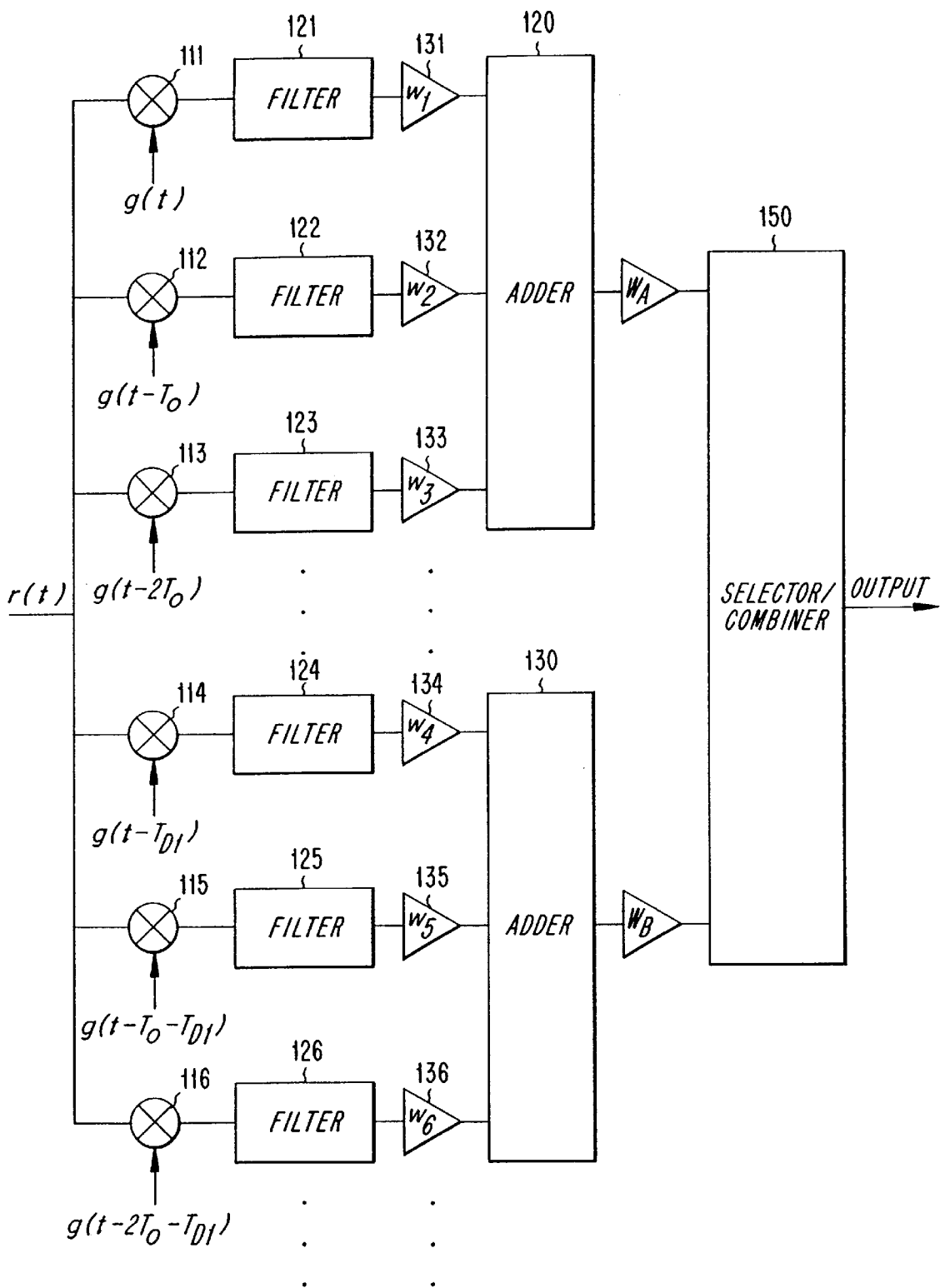
FIG. 3 is a block diagram of a multipath processor using two sets of correlators for despreading a spread-spectrum signal received as two groups of spread-spectrum signals.

As shown in FIG. 3, the first despreading means may include a first plurality of correlators for despreading, respectively, the first plurality of spread-spectrum signals. The first plurality of correlators is illustrated, by way of example, as first multiplier 111, second multiplier 112, third multiplier 113, first filter 121, second filter 122, third filter 123, first chipping-sequence signal g(t), second chipping-sequence signal g(t-$T_o$), and third chipping-sequence signal g(t-$2T_o$). The second chipping-sequence signal g(t-$T_o$) and the third chipping-sequence signal g(t-$2T_o$) are the same as the first chipping-sequence signal g(t), but delayed by time $T_o$ and time $2T_o$, respectively. The delay between each chipping-sequence signal, preferably, is a fixed delay $T_o$. At the input is received signal r(t). The first multiplier 111 is coupled between the input and the first filter 121, and to a source of the first chipping-sequence signal g(t). The second multiplier 112 is coupled between the input and the second filter 122, and to a source of the second chipping-sequence signal g(t-$T_o$). The third multiplier 113 is coupled between the input and the third filter 123, and to a source of the third chipping-sequence signal g(t-$2T_o$). The outputs of the first filter 121, the second filter 122 and the third filter 123 are coupled to the first adder 120.

Figure 4:
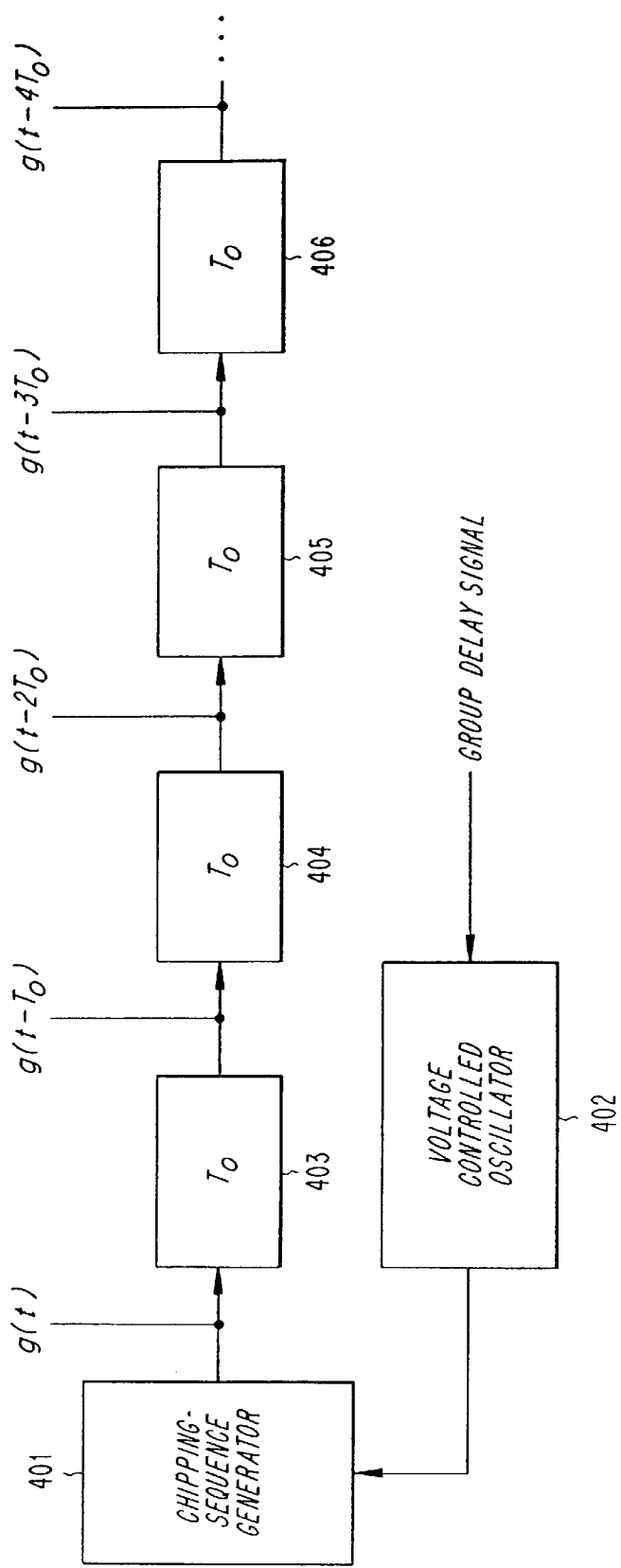
FIG. 4 is a block diagram for generating chipping-sequence signals with delays.

Circuitry and apparatus are well known in the art for generating chipping-sequence signals with various delays. Referring to FIG. 4, a chipping-sequence generator 401 is coupled to a voltage-controlled oscillator 402, and a plurality of delay devices 403, 404,405,406. The voltage-controlled oscillator receives a group-delay signal. The group-delay signal corresponds to the time delay that the group of chipping-sequence signals used for despreading a particular group of received signals. The voltage-controlled oscillator 402 generates an oscillator signal. The chipping-sequence generator 401 generates the first chipping-sequence signal g(t) from the oscillator signal, with an initial position of the first chipping-sequence signal g(t) determined from the group-delay signal. The first chipping-sequence signal g(t) is delayed by the plurality of delay devices 403, 404, 405, 406, to generate the second chipping-sequence signal g(t-T$_o$), the third chipping-sequence signal g(t-2T$_o$), the fourth chipping-sequence signal (gt-3T$_o$), etc. Thus, the second chipping-sequence signal g(t-2T$_o$) and the third chipping-sequence signal g(t-2T$_o$) may be generated as delayed versions of the first chipping-sequence signal g(t). Additionally, acquisition and tracking circuitry are part of the receiver circuit for acquiring a particular chipping-sequence signal embedded in a received spread-spectrum signal.

Optionally, the multipath processor of FIG. 3 may include first weighting device 131, second weighting device 132 and third weighting device 133. The first weighting device 131 is coupled to the output of the first filter 121, and a source of a first weighting signal W$_1$. The second weighting device 132 is coupled to the output of the second filter 122, and to a source of the second weighting signal W$_2$. The third weighting device 133 is coupled to the output of the third filter 123 and to a source of the third weighting signal W$_3$. The first weighting signal W$_1$, the second weighting signal W$_2$ and the third weighting signal W$_3$ are optional, and may be preset within the first weighting device 131, the second weighting device 132 and the third weighting device 133, respectively. Alternatively, the first weighting signal W$_1$, the second weighting signal W$_2$, and the third weighting signal W$_3$ may be controlled by a processor or other control circuitry. The outputs of the first filter 121, the second filter 122, and the third filter 123 are coupled through the first weighting device 131, the second weighting device 132 and the third weighting device 133, respectively, to the first adder 120.

Similarly, the second despreading means may include a second plurality of correlators for despreading the second plurality of spread-spectrum signals. The second plurality of correlators is illustrated, by way of example, as fourth multiplier 114, fifth multiplier 115, sixth multiplier 116, fourth filter 124, fifth filter 125, sixth filter 126, fourth chipping-sequence signal g(t-T$_{D1}$), fifth chipping-sequence signal g(t-T$_o$-T$_{D1}$), and sixth chipping-sequence signal g(t-2T$_o$-T$_{D1}$). The fourth multiplier 114 is coupled between the input and the fourth filter 124, and a source of the fourth chipping-sequence signal g(t-T$_{D1}$). The fifth multiplier 115 is coupled between the input and the fifth filter 125 and a source of the fifth chipping-sequence signal g(t-T$_o$-T$_{D1}$) The sixth multiplier 116 is coupled between the input and the sixth filter 126, and a source of the sixth chipping-sequence signal g(t-2T$_o$-T$_{D1}$) The fourth chipping-sequence signal g(t-T$_{D1}$), the fifth chipping-sequence signal g(t-T$_o$-T$_{D1}$) and the sixth chipping-sequence signal g(t-2T$_o$-T$_{D1}$) are the same as the first chipping-sequence signal g(t), but delayed by time T$_{D1}$ time T$_o$+T$_{D1}$, and time 2T$_o$+T$_{D1}$, respectively. The second plurality of correlators thereby generates the second plurality of despread signals. The outputs of the fourth filter 124, the fifth filter 125 and the sixth filter 126 are coupled to the second adder 130.

At the output of the fourth filter 124, the fifth filter 125, and the sixth filter 126, optionally, may be fourth weighting device 134, fifth weighting device 135, and sixth weighting device 136. The fourth weighting device 134, fifth weighting device 135, and sixth weighting device 136 are coupled to a source which generates fourth weighting signal W$_4$, fifth weighting signal W$_5$, and sixth weighting signal W$_6$, respectively. The fourth weighting signal W$_4$, the fifth weighting signal W$_5$, and the sixth weighting signal W$_6$ are optional, and may be preset within the fourth weighting device 134, the fifth weighting device 135, and the sixth weighting device 136, respectively. Alternatively, the fourth weighting signal W$_4$, the fifth weighting signal W$_5$, and the sixth weighting signal W$_6$ may be controlled by a processor or other control circuitry. The outputs of the fourth filter 124, fifth filter 125, and sixth filter 126 are coupled through the fourth weighting device 134, fifth weighting device, 135 and sixth weighting device 136, respectively, to the second adder 130. The output of the first adder 120 and the second adder 130 are coupled to the decision device 150. The decision device 150 may be a selector or a combiner.

The weighting devices may be embodied as an amplifier or attenuation circuits, which change the magnitude and phase. The amplifier or attenuation circuits may be implemented with analog devices or with digital circuitry. The amplifier circuit or attenuation circuit may be adjustable, with the gain of the amplifier circuit or attenuation circuit controlled by the weighting signal. The use of a weighting signal with a particular weighting device is optional. A particular weighting device may be designed with a fixed weight or a preset amount, such as a fixed amount of amplifier gain.

FIG. 5 is a tapped-delay-line model of a communications channel. A signal s(t) entering the communications channel passes through a plurality of delays 411, 412, 413, 414, modeled with time T$_o$. The signal s(t), for each delay, is attenuated 416, 417, 418 by a plurality of complex attenuation factors h$_{n-1}$, h$_n$, and adder 419. The OUTPUT from the adder 419 is the output from the communications channel.

A given communications channel has a frequency response which is the Fourier transform of the impulse response.

$$H(f) = \sum_{i=1}^{N} a_i e^{-j2\pi f \tau_i}$$

where a$_i$ represents the complex gains of the multipaths of the communications channel, and $\tau_i$ represents the delays of the multipaths of the communications channel
where a$_i$ represents the complex gains of the multipaths of the communications channel, and t$_i$ represents the delays of the multipaths of the communications channel.

Consider the communications-channel-frequency response, H$_c$(f). The communications-channel-frequency response has a band of interest, B. Hereafter, this band of interest is fixed, and the communications-channel-frequency response H$_c$(f) is the equivalent lowpass filter function. The communications-channel-frequency response expands in Fourier series as $$H_c(f) = \sum h_n e^{-jn2\pi f/B}$$

where h$_n$ represents Fourier coefficients. This is a tapped-delay-line model of the communications channel for which the receiver in FIG. 3 acts as a matched filter when T$_o$=1/B, and the weights W$_n$ are set to the complex conjugate of the values h$_n$. That is, W$_n$=h$_n$.

Preferably, each correlator of the first plurality of correlators despreads with a chipping-sequence signal g(t) which has a time delay different from each time delay of each chipping-sequence signal used, respectively, with each of the other correlators of the first plurality of correlators. The first plurality of correlators uses chipping-sequence signals g(t), g(t-$T_o$), g(t-2$T_o$), where $T_o$ is the time delay between chipping-sequence signals. The time delay $T_o$ may be the same or different between each chipping-sequence signal. For illustrative purposes, time delay $T_o$ is assumed to be the same.

Similarly, each correlator of the second plurality of correlators despreads with a chipping-sequence signal having a time delay different from each time delay of each other chipping-sequence signal used, respectively, with each of the other correlators of the second plurality of correlators. Also, each correlator of the second Plurality of correlators despreads with a chipping-sequence signal having the time delay $T_{D1}$ different from each time delay of each chipping-sequence signal used with each respective correlator of the first plurality of correlators. Thus, the second plurality of correlators uses chipping-sequence signals g(t-$T_{D1}$), g(t-$T_o$-$T_{D1}$), g(t-2$T_o$-$T_{D1}$), where time delay $T_{D1}$ is the time delay between the first plurality of correlators and the second plurality of correlators. The time delay $T_{D1}$ is also approximately the same time delay as between the first received group of spread-spectrum signals and the second received group of spread-spectrum signals.

FIG. 6 illustrates a correlator, where an input signal s(t) is multiplied by multiplier 674 by a delayed version of the input signal s(t-T). The product of the two signals is filtered by the filter 675, and the output is the autocorrelation function R(T). The autocorrelation function R(T) for a square wave input signal s(t) is shown in FIG. 7. Over a chip time $T_c$, the correlation function R(T) is maximized when points A and B are equal in amplitude. A circuit which is well known in the art for performing this function is shown in FIG. 8. In FIG. 8, the despread signal s(t) is delayed by a half chip time $T_{c/2}$, and forwarded by half a chip time $T_{c/2}$. Each of the three signals are multiplied by the received signal r(t). The outputs of the delayed and forwarded multiplied signals are filtered, and then amplitude detected. The two filtered signals are combined by subtracting the delayed version from the forwarded version, and the difference or error signal is used to adjust the timing of the chipping-sequence signal used to despread signal s(t). Accordingly, if the delayed version were ahead of the forwarded version, the chipping-sequence signal for despread signal s(t) would be delayed. Likewise, if the forwarded version were ahead of the delayed version, then the chipping-sequence signal for despreading signal s(t) would be advanced. These techniques are well known in the art.

A similar technique is used for estimating a pilot signal from a received signal r(t), which has passed through a multipath environment. Referring to FIG. 9, the lower part of the diagram shows correlators corresponding to the correlators previously shown in FIG. 3. The upper part of the diagram shows the received signal processed by delayed versions or the pilot chipping-sequence signal $g_p$(t). In FIG. 9, the received signal r(t) is multiplied by the pilot signal $g_p$(t) and a plurality of delayed versions of the pilot signal $g_p$(t-$T_o$), . . . , $g_p$(t-k$T_o$) by a plurality of multipliers 661, 651, 641. The output of the plurality of multipliers 601, 651, 641, are each filtered by a plurality of filters 662, 652, 642, respectively. The output of the plurality of filters 662, 652, 642 are multiplied by a second plurality of multipliers 663, 653, 643 and respectively filtered by a second plurality of filters 664, 654, 644. The outputs of the second plurality of filters 664, 654, 644 are processed through a plurality of complex conjugate devices 665, 655, 645. The outputs of the plurality of complex conjugate devices 665, 655, 645 are the plurality of weights $W_1$, $W_2$, $W_k$, respectively. The plurality of weights are multiplied by the output of the first plurality of filters 662, 652, 642, by a third plurality of multipliers 666, 656, 646, and then combined by the combiner 667. At the output of the combiner 667 is a combined-despread-pilot signal.

Each of the second plurality of pilot filters 664, 654, 644 has a bandwidth which is approximately equal to the fading bandwidth. This bandwidth typically is very narrow, and may be on the order of several hundred Hertz.

Referring to FIG. 10, the output of the combiner 667 is multiplied by a fourth multiplier 668, and passed through an imaginary device 669 for determining the imaginary component of the complex signal from the fourth multiplier 668. The output of the imaginary device 669 passes through a loop filter 672 to a voltage controlled oscillator 673 or a numerically controlled oscillator (NCO). The output of the voltage controlled oscillator 673 passes to the fourth multiplier 668 and to each or the second plurality of multipliers 663, 653, 643.

Referring to FIG. 11, the foregoing circuits can generate a cross-correlation function between the received signal and a referenced pilot-chipping signal as a function of referenced delay, or lag. As shown in FIG. 11, these points of cross-correlation can have a center of gravity. The center of gravity is determined when the left mass equals the right mass of the correlation function, as shown in FIG. 12. A circuit similar to that shown in FIG. 8, coupled to the output of the fourth multiplier 668, can be used for aligning a chipping-sequence signal of the pilot channel.

As an alternative embodiment, as shown in FIG. 13, the first despreading means may include a first plurality of matched filters for despreading the received signal r(t) having the first plurality of spread-spectrum signals. At the output of the first plurality of matched filters is the first plurality of despread signals. Each matched filter of the first plurality of matched filters has an impulse response h(t), h(t-$T_o$), h(t-2$T_o$), etc., with a time delay $T_o$ offset from the other matched filters. Referring to FIG. 13, by way of example, a first matched filter 141 is coupled between the input and through the first weighting device 131 to the first adder 120. A second matched filter 142 is coupled between the input and through the second weighting device 132 to the first adder 120. A third matched filter 143 is coupled between the input and through the third weighting device 133 to the first adder 120. As mentioned previously, the first weighting device 131, the second weighting device 132, and the third weighting device 133 are optional. The first weighting device 131, the second weighting device 132, and the third weighting device 133 generally are connected to a source of the first weighting signal $W_1$, the second weighting signal $W_2$, and the third weighting signal $W_3$, respectively. The first plurality of matched filters generates the first plurality of despread sgnals.

Similarly, the second despreading means may include a second plurality of matched filters for despreading the received signal r(t) having the second plurality of spread-spectrum signals. Accordingly, at the output of the second plurality of matched filters is the second plurality of despread signals. Each matched filter of the second plurality of matched filters has an impulse response, h(t-$T_{D1}$), h(t-$T_o$-$T_{D1}$) h(t-2$T_o$-$T_{D1}$), etc., with a time delay $T_o$ offset from the other matched filters and with a time delay $T_{D1}$ offset from the first plurality of matched filters. A fourth matched filter 144 is coupled between the input and through the fourth weighting device 134 to the second adder 130. A fifth matched filter 145 is coupled between the input, and through the fifth weighting device 135 to the second adder 130. A sixth matched filter 146 is coupled between the input and through the sixth weighting device 136 to the second adder 130. As mentioned previously, the fourth weighting device 134, the fifth weighting device 135, and the sixth weighting device 136 are optional. The fourth weighting device 134, the fifth weighting device 135, and the sixth weighting device 136, are coupled respectively to a source for generating the fourth weighting signal $W_4$, the fifth weighting signal $W_5$, and the sixth weighting signal $W_6$. Also, as with the correlator embodiment, the first adder 120 and the second adder 130 are coupled to the decision device 150. The decision device 150 may be embodied as a selector or a combiner.

The present invention may further include despreading spread-spectrum signals located within a third group. Accordingly, the present invention may include third despreading means and third combining means. The third combining means is coupled between the third despreading means and the selecting means.

As shown in FIG. 14, the third despreading means despreads the received signal r(t) received as a third plurality or spread-spectrum signals within a third group. Accordingly, the third despreading means generates a third plurality of despread signals. The third combining means combines the third plurality of despread signals as a third combined-despread signal. The selecting means selects one of the first combined-despread signal, the second combined-despread signal or the third combined-despread signal. The output of the selecting means is the output-despread signal.

As shown in FIG. 14, the third despreading means may include a third plurality of correlators for despreading the third plurality of spread-spectrum signals. The third plurality of correlators is illustrated, by way of example, with seventh multiplier 117, eighth multiplier 118, ninth multiplier 119, seventh filter 127, eighth filter 128, ninth filter 129, and a source for generating the seventh chipping-sequence signal $g(t-T_{D2})$, the eighth chipping-sequence signal $g(t-T_o-T_{D2})$, and the ninth chipping-sequence signal $g(t-T_o-T_{D2})$. The seventh multiplier 117 is coupled between the input and the seventh filter 127. The eighth multiplier 118 is coupled between the input and the eighth filter 128. The ninth multiplier 119 is coupled between the input and the ninth filter 129. The seventh multiplier 117, the eighth multiplier 118, and the ninth multiplier 119, are coupled to the source for generating the seventh chipping-sequence signal, the eighth chipping-sequence signal and the ninth chipping-sequence signal, respectively. Optionally, at the output of the seventh filter 127, eighth filter 128, and ninth filter 129, may be seventh weighting device 137, eighth weighting device 138, and ninth weighting device 139, respectively. Accordingly, the output of the seventh filter 127 is coupled through the seventh weighting device 137 to the. third adder 140. The-output of the eighth filter 128 is coupled through the eighth weighting device 138 to the third adder 140. The output of the ninth multiplier 129 is coupled through the ninth weighting device 139 to the third adder 140. The third adder is coupled to the decision device 150. At the output of the third plurality of correlators is the third plurality of despread signals, respectively.

Preferably, each correlator of the third plurality of correlators despreads with a chipping-sequence signal $g(t-T_{D2})$, $g(t-T_o-T_{D2})$, $g(t-2T_o-T_{D2})$ having a time delay $T_o$ different from each time delay of each chipping-sequence signal used with other correlators of the third plurality of correlators. Also, each correlator of the third plurality of correlators despreads with a chipping-sequence signal having a time delay different from each time delay of each chipping-sequence signal used, respectively, with each correlator of the second plurality of correlators. Also, each correlator of the third plurality of correlators despreads with a chipping-sequence signal having a time delay $2T_D$ different from each chipping-sequences signal used with each correlator of the first plurality of correlators.

Alternatively, the third despreading means may include, as shown in FIG. 15, a third plurality of matched filters for despreading the third plurality of spread-spectrum signals. The third plurality of matched filters includes seventh matched filter 147, eighth matched filter 148, and ninth matched filter 149. The seventh matched filter is coupled between the input and through the seventh weighting device 137 to the third adder 140. The eighth matched filter 148 is coupled between the input and through the eighth weighting device 138 to the third adder 140. The ninth-matched filter 149 is coupled between the input and through the ninth weighting device 139 to the third adder 140. The third adder 140 is coupled to the decision device 150. At the output of the third plurality of matched filters is the third plurality of despread signals.

The present invention may include fourth despreading means and fourth combining means, with the fourth combining means coupled between the fourth despreading means and the selecting means. The fourth despreading means would despread a fourth plurality of spread-spectrum signals within a fourth group. The output of the fourth despreading means would be a fourth plurality of despread signals. The fourth combining means would combine the fourth plurality of despread signals as a fourth combined-despread signal. The selecting means selects one of the first combined-despread signal, the second combined-despread signal, the third combined-despread signal, or the fourth combined-despread signal, as the output-despread signal.

In a similar fashion, the fourth despreading means includes a fourth plurality of correlators, or a fourth plurality of matched filters, for despreading the fourth plurality of spread-spectrum signals for generating the fourth plurality of despread signals. Each correlator of the fourth plurality of correlators would despread with a chipping-sequence signal having a time delay different from each time delay of each chipping-sequence signal used, respectively, with other correlators of the fourth plurality of correlators. Also, the chipping-sequence signal would be different from the chipping-sequence signals used with each correlator of the third plurality of correlators, each chipping-sequence signal used with each correlator of the second plurality of correlators, and each chipping-sequence signal used with each correlator of the first plurality of correlators. Based on the disclosure herein, a person skilled in the art would-readily know how to extend the concept to a fifth group or spread-spectrum signals, or more generally, to a plurality of groups of spread-spectrum signals.

Each of the matched filters may be realized using surface-acoustic-wave (SAW) devices, digital matched filters, or embodied in an application specific integrated circuit (ASIC) chip or a digital signal processor (DSP) chip. Techniques for designing matched filters using these devices are well known in the art.

A multipath processor can single out individual paths from a group of rays. The weight for each weighting device is figured out by sets of correlators, and with a reference code it is possible to track the chipping-sequence signal in each ray.

Alternatively, a method using a multipath processor may be used for tracking a spread-spectrum signal within a plurality-of groups. The method comprises the steps of despreading the received signal r(t) received as the first plurality of spread-spectrum signals within a first group to generate a first plurality of despread signals. The first plurality of despread signals are then combined as a first combined-despread signal. The method would include despreading the received signal r(t) received as a second plurality of spread-spectrum signals within a second group to generate a second plurality of despread signals. The second plurality of despread signals would be combined as a second combined-despread signal. The method includes selecting either the first combined-despread signal or the second combined-despread signal, as an output-despread signal.

The step of despreading the first plurality of spread-spectrum signals may include the step of correlating or matched filtering the first plurality of spread-spectrum signals, using a first plurality of correlators or a first plurality of matched filters, respectively. The step of despreading the second plurality of spread-spectrum signals may include the step of correlating or matched filtering the second plurality of spread-spectrum signals using a second plurality of correlators or a second plurality of matched filters, respectively.

The method may further include despreading a third plurality of spread-spectrum signals within a third group to generate a third plurality of despread signals. The third plurality of despread signals would be combined as a third combined-despread signal. The selecting step would thereby include selecting one of the first combined-despread signal, the second combined-despread signal or the third combined-despread signal, as the output-despread signal. Similarly, the step of despreading the third plurality of spread-spectrum signals may include the step of correlating or matched filtering the third plurality of spread-spectrum signals using a third plurality of correlators or a third plurality of matched filters, respectively.

The-step of despreading each of the first plurality of spread-spectrum signals would include the step of despreading with a chipping-sequence signal having a time delay different from each time delay of each chipping-sequence signal used to despread other spread-spectrum signals of the first plurality of spread-spectrum signals. Similarly, the step of despreading each of the second plurality of spread-spectrum signals would include the step of despreading with a chipping-sequence signal having a time delay different from each time delay of each chipping-sequence signal used to despread other spread-spectrum signals of the second plurality of spread-spectrum signals. Also, the step of despreading each of the second plurality of spread-spectrum signals would include the step of despreading with a chipping-sequence signal having a time delay different from each time delay of each. chipping-sequence signal used to despread other spread-spectrum signals of the first plurality of spread-spectrum signals.

In the event the method includes the step of despreading a third plurality of spread-spectrum signals, the method would include the steps of despreading with a chipping-sequence signal having a time delay different for each time delay of each chipping-sequence signal used to despread other spread-spectrum signals of the third plurality of spread-spectrum signals. Also, the time delay would be different for each chipping-sequence signal used to despread spread-spectrum signals of the second plurality of spread-spectrum signals, and different from each time delay of each chipping-sequence signal used to despread spread-spectrum signals of the first plurality of spread-spectrum signals.

The method may be extended to a fourth, fifth or plurality of groups of spread-spectrum signals.

Variable Bandwidth Filter

The present invention also includes a variable-bandwidth spread-spectrum device for use with a spread-spectrum transmitter. The variable-bandwidth spread-spectrum device generates a spread-spectrum signal having a spread bandwidth. The term "spread bandwidth", as used herein, denotes the bandwidth of the transmitted spread-spectrum signal. The variable-bandwidth spread-spectrum device uses a chipping-sequence signal having a chipping rate which is less than the spread bandwidth. The term "chipping rate", as used herein, denotes the bandwidth of the chipping-sequence signal.

The variable-bandwidth spread-spectrum device includes first generating means, second generating means, spread-spectrum processing means, and filtering means. The spread-spectrum processing means is coupled to the first generating means. The second generating means is coupled between the spread-spectrum processing means and the filtering means.

The first generating means generates the chipping-sequence signal with the chipping rate. The spread-spectrum processing means processes a data signal with the chipping-sequence signal to generate a spread-data signal. The second generating means generates an impulse signal, in response to each chip of the spread-data signal. The filtering means filters the spectrum of each impulse signal with a bandpass equal to the spread bandwidth.

As illustratively shown in FIG. 16, the first generating means may be embodied as a chipping-sequence generator 161, the second generating means may be embodied as an impulse generator 165, the spread-spectrum processing means may be embodied as an EXCLUSIVE-OR gate product device 164, or other device known to those skilled in the art for mixing a data signal with a chipping-sequence signal, and the filtering means may be embodied as a filter 166.

The product device 164 is coupled to the chipping-sequence generator 161. The impulse generator 165 is coupled between the product device 164 and the filter 166.

The chipping-sequence generator 161 generates the chipping-sequence signal with the chipping rate. The product device 164 processes the data signal with the chipping-sequence signal, thereby generating a spread-data signal as shown in FIG. 17. The impulse generator 165 generates an impulse signal, as shown in FIG. 18, in response to each chip in the spread-data signal shown in FIG. 17. Each impulse signal of FIG. 18 has an impulse bandwidth. The term "impulse bandwidth", as used herein, denotes the bandwidth of the impulse signal. While theoretically an impulse signal has infinite bandwidth, practically, the impulse signal has a bandwidth which is greater than the spread bandwidth.

The filter 166 has a bandwidth adjusted to the spread bandwidth. Thus, the filter 166 filters a spectrum of each impulse signal of the spread-data signal with the spread bandwidth. The filter 166 does this for each impulse signal.

The filter 166 preferably includes a variable-bandwidth filter. The variable-bandwidth filter may be used for varying or adjusting the spread bandwidth of the spectrum for each impulse signal. Accordingly, a spread-spectrum signal may be designed having the bandwidth of choice, based on the bandwidth of the variable-bandwidth filter. The bandwidth may be variable, or adjustable, as would be required for particular system requirements. As used in this patent, a variable bandwidth is one that is able to vary according to time conditions, background signals or interference, or other requirements in a particular system. An adjustable bandwidth would be similar to a variable bandwidth, but is used to refer to a bandwidth which may be adjusted to remain at a chosen setting.

The first generating means, as shown in FIG. 19, may include a frequency-domain-chipping-sequence generator 161 and an inverse-Fourier-transform device 162. The frequency-domain-chipping-sequence generator 161 may be used to generate a frequency-domain representation of a chipping-sequence signal. The inverse-Fourier-transform device 162 transforms the frequency-domain representation of the chipping-sequence signal to the chipping-sequence signal.

The first generating means may further include a memory 163 for storing the chipping-sequence signal.

The present invention also includes a variable-bandwidth spread-spectrum method for use with a transmitter. The method includes the steps of generating the chipping-sequence signal with the chipping rate, and spread-spectrum processing a data signal with the chipping-sequence signal to generate a spread-data signal. Each chip in the spread-spectrum signal is used to generate an impulse signal. Each impulse signal is filtered with the spread bandwidth to generate the desired bandwidth signal.

Thus, the variable-bandwidth-spread-spectrum device uses a lower chip rate, but provides a wider bandwidth signal. The power spectral density at the output of the filter 166 of the filtered-spread-data signal s(t) is proportional to the frequency response H(f) of the filter.

$$PSD_{s(t)} = k|H(f)|^2$$

Thus, the filter 166 controls the shape of the spectrum of the filtered-spread-data signal.

The processing gain (PG) is bandwidth W of the filtered-spread-data signal divided by chip rate Rb of the filtered-spread-data signal.

$$PG = W/R_b$$

F. The capacity N of the filtered-spread-data signal is $$N \le \frac{PG}{E_b/N_o} + 1$$

The capacity does not depend on chip rate, but instead on bandwidth. One can achieve an upper bound on the capacity if the chip rate is greater than the bandwidth. But, if the chip rate were lower, then one can save power consumption, i.e., use a lower clock rate of CMOS, which determines power consumption.

Adaptive Power Control System

The present invention assumes that a plurality of mobile stations operate in a cellular-communications network using spread-spectrum modulation. The cellular communications network has a plurality of geographical regions, with a multiplicity of cells within each geographical region. The size of the cells in a first geographical region may differ from the size of the cells in a second geographical region. In a first geographical region, such as an urban environment, the cellular architecture may have a large number of cells, each of small area, which place the corresponding base station close to each other. In a second geographical region, such as a rural environment, the cellular architecture may have a smaller number of cells, each of larger area. Further, the size of the cells may vary even within a specified geographic region.

A mobile station, while in the urban environment of the first geographical region, may be required to transmit at a lower power level than while in the rural environment of the second geographical region. This requirement might be due to a decreased range of the mobile station from the base station. Within a particular cell, a mobile station near the base station of the cell may be required to transmit with a power level less than that required when the mobile station is near an outer perimeter of the cell. This adjustment in power level is necessary to ensure a constant power level is received at the base station from each mobile station.

Adaptive power control works by measuring the received signal to noise ratio (SNR) for each user and causing the user transmitted power to vary in a manner to cause all users' SNR's to be equal to a common value which will be adequate for, reliable communication if the total number of users and interference is less than system capacity. While this assumes that all users are obtaining the same service, e.g., 32 kbs voice data, it is a feature of the system described that different service options are supported for requesting users. This is done by adjusting the setpoint for each user independently.

There are two issues that arise when addressing the base operation of an adaptive power control system. The first is the common value obtained for SNR versus the load and its cost to the transmitters in terms of transmitted power, and the second is the stability of the system. Stability means that a perturbation of the system from its quiescent state causes a reaction of the system to restore the quiescent condition. It is highly desirable that there exist only one quiescent point because otherwise "chatter" or oscillation may occur. Stability must be addressed with any control system but, in the present case, the situation is somewhat complicated by the fact that the users affect one another, and thereby cause the control variables, the transmitted power and resulting SNR's, to be dynamically coupled. The coupling is apparent when one realizes that all signals are processed by a common AGC function which does not discriminate individual user signals from each other or from other sources.

The power control scheme of the present invention is a closed loop scheme. The system measures the correlator output power for each user and compares the measured value with a target value or setpoint. This measured power includes both the desired signal component and unwanted power or noise.

The AGC maintains the total power into each correlator at a preset level. This level does not vary as a function of APC action; that is, this role of the AGC is independent of APC. Furthermore, an increase in received power from any user or subset of users will be "attacked" by the AGC. This is possible because the AGC time constant is smaller than the APC time constant, i.e., the AGC is faster than the APC. Since the total power available out of the AGC is fixed, an increase in the portion due to one user comes at the expense of all other users. While this may work against the apparent stability of the system, the AGC sensor, which measures the AGC control signal and thereby measures the total received power, causes the system to seek a quiescent state corresponding to the minimum received power per user. It is desired that the transmitted power be minimized because this will minimize intercell interference and conserve battery power. Excess transmitter power will be dissipated within the AGC as long as all users transmit excessive power.

The implementation shown in the figures is to be considered representative. In particular, the method of controlling the remote transmitter power via attenuators and variable gain amplifiers is perhaps redundant. Either or both of these means may be employed, depending upon the (dynamic) range of control required. Also, control may be caused at either IF or RF frequencies.

For discussion purposes, a mobile station within a particular cell transmits a first spread-spectrum signal, and the base station transmits a second spread-spectrum signal. In the exemplary arrangement shown, in FIG. 20, a block diagram of a base station as part of a system for adaptive-power control of a spread-spectrum transmitter is provided.

FIG. 20 illustrates the base station adaptive power control system with automatic gain control (AGC) means, power means, comparator means, transmitter means, and an antenna. The AGC means is shown as an automatic-gain-control (AGC) amplifier 228, correlator means is shown as despreader 231, and power means is shown as power measurement device 233. The comparator means is shown as comparator 239, the transmitter means is shown as power amplifier 237 coupled to the antenna 226. Also illustrated is a delta modulator 235 coupled between comparator 239 and power amplifier 237.

The AGC amplifier 228 is coupled to the despreader 231. The power measurement device 233 is coupled to the despreader 231. The comparator 239 is coupled to the, output of the power measurement device 233 and to the AGC amplifier 228. The multiplexer 234 is coupled between the comparator 239 and the power amplifier 237. The delta modulator 235 is coupled between the power amplifier 237 and the multiplexer 234. The power amplifier 237 is coupled to the antenna 226.

A threshold level is used by the comparator 239 as a comparison for the received-power level measured by the power measurement device 233.

For each received signal, the. AGC amplifier 228 generates an AGC-output signal and an AGC-control signal. The AGC-output signal is despread to obtain the signal of a first user using despreader 231. The despread-AGC-output signal from the despreader 231 is combined with the AGC-control signal from the. AGC amplifier 228, by the combiner 241. The AGC-control signal from the AGC amplifier 228 may be offset by offset level $S_1$ using combiner 242, and weighted by weighting device 243. The weighting device 243 may be an amplifier or attenuator.

The received-power level from power device 233 may be offset by offset level $S_2$ using combiner 244, and weighted by weighting device 245. The weighting device 245 may be an amplifier or attenuator. The combiner 241 combines the AGC-control signal with the received-level signal, for generating adjusted-received-power level. The comparator 239 generates a comparison signal by comparing the adjusted-received-power level to the threshold level. The comparison signal may be an analog or digital data signal. The comparison signal indicates whether the mobile station is to increase or decrease its power level. If the adjusted-received-power level exceeds the threshold, for example, then the comparison signal sends a message to the mobile station to decrease its transmitter power. If the adjusted-received-power level were below the threshold, then the comparison signal sends a message to the mobile station to increase its transmitter power. The comparison signal is converted to a power-command signal by the delta modulator 235.

The power-command signal may be transmitted with or separate from the second spread-spectrum signal. For example, a spread-spectrum signal using a first chip sequence may be considered a first spread-spectrum channel, and a spread-spectrum signal using a second chip sequence may be considered a second spread-spectrum channel. The power-command signal may be transmitted in the same spread-spectrum channel, i.e., the first spread-spectrum channel, as the second spread-spectrum signal, in which case the power-command signal is transmitted at a different time interval from when the second spread-spectrum signal is transmitted. This format allows the mobile station to acquire synchronization with the first sequence, using the second spread-spectrum signal. The power-command signal may also be transmitted in a second spread-spectrum channel which is different from the second spread-spectrum signal. In this case, the second spread-spectrum signal having the power-command signal would be acquired by the second chipping-sequence generator and second product device. The power-command signal may be time division multiplexed or frequency division multiplexed with the second spread-spectrum signal.

The base-correlator means is depicted in FIG. 20 as first despreader 231. The system, by way of this example, may have the base-correlator means embodied as a product device, a chip-sequence generator, and a bandpass filter. Alternatively, the base-correlator means may be realized as a matched filter such as a surface-acoustic-wave device, or as a digital matched filter embodied in a digital signal processor. In general, the base-correlator means uses or is matched to the chip sequence of the spread-spectrum signal being received. Correlators and matched filters for despreading a spread-spectrum signal are well known in the art.

Typically, the AGC circuit 228 is coupled to a low noise amplifier 227, through an isolator 225 to the antenna 226. In FIG. 20 a plurality of despreaders, despreader 229 through despreader 231, are shown for despreading a plurality of spread-spectrum channels which may be received from a plurality of mobile stations. Similarly, the output of each despreader 229 through despreader 231 is coupled to a plurality of demodulators, illustrated as demodulator 230 through demodulator 232, respectively, for demodulating data from the despread AGC-output signal. Accordingly, a plurality of data outputs are available at the base station.

For a particular spread-spectrum channel, the first despreader 231 is shown coupled to power device 233 and multiplexer 234. The power device 233 typically is a power-measurement circuit which processes the despread AGC-output signal as a received-power level. The power device 233 might include an analog-to-digital converter circuit for outputting a digital received-power level. The comparator means, embodied as comparator circuit 239, compares the processed received-power level to a threshold. The multiplexer 234 is coupled to the output of the power device 233 through the comparator circuit 239. The multiplexer 234 may insert appropriate framing bits, as required.

The transmitter means may be embodied as a quadrature phase shift keying (QPSK) modulator or a delta modulator 235 coupled to a power amplifier 237. In FIG. 20, the input to the delta modulator 235 typically would have the comparison signal from the comparator 239 multiplexed with data from the $k^{th}$ channel. The delta modulator 235 converts the comparison signal to a power-command signal. A plurality of spread spectrum channels would have their data and appropriate power-command signals combined by combiner 236 and amplified by power amplifier 237. The output of the power amplifier 237 is coupled through the isolator 125 to the antenna 226.

The power command signal is transmitted periodically. The period T might be chosen to be 250 microseconds in order to ensure a low root mean square error as well as a low peak error between the instantaneous received signal and the constant desired signal.

A mobile station is illustratively shown in FIG. 21. The mobile-despreading means is illustrated as despreader 334 and variable-gain means is illustrated as a variable-gain device 341. The variable-gain device 341 is coupled between the transmitter 342 and through isolator 336 to antenna 335. The despreader 334 is coupled to the isolator 336 and to demultiplexer 339. The output of the despreader 334 is also coupled to a demodulator 340. The despreader 334 may be embodied as an appropriate correlator, or matched filter, for despreading the $k^{th}$ channel. Additional circuitry may be used, such as radio frequency (RF) amplifiers and filters, or intermediate frequency (IF) amplifiers and filters, as is well known in the art.

A received second spread-spectrum signal at antenna 335 passes through isolator 336 to despreader 3.34. The despreader 334 is matched to the chip sequence of the desired spread-spectrum channel. The output of the despreader 334 passes through the demodulator 340 for demodulating the data from the desired spread-spectrum channel. Additionally, the demultiplexer 339 demultiplexes the power-command signal from the despread signal outputted from despreader 334. The power-command signal drives the variable-gain device 341.

A decision device 345 and accumulator 346 may be coupled between the demultiplexer 339 and the variable gain device 341. A step-size-algorithm device 344 is coupled to the output of the decision device 345 and to the accumulator 346.

The step-size-algorithm device 344 stores an algorithm for adjusting the power level of the variable gain device 341. A nonlinear algorithm that might be used. is shown in FIG. 22. FIG. 23 compares a nonlinear algorithm with a linear step size algorithm.

The power-command signal from the demultiplexer 339 causes the decision device 345 to increase or decrease the power level of the variable gain device 341, based on the threshold of the step size algorithm shown in FIG. 23. The accumulator tracks previous power levels as a means for assessing the necessary adjustments in the step size of the power level pursuant to the algorithm as shown in FIG. 23.

The variable-gain device 341 may be embodied as a variable-gain amplifier, a variable-gain attenuator, or any device which performs the same function as the variable-gain device 341 as described herein. The variable-gain device 341 increases or decreases the power level of the remote station transmitter, based on the power-command signal.

As illustratively shown in FIG. 20, a block diagram of a power measurement circuit includes interference rejection for use with the base station. As shown in FIG. 20, the AGC amplifier 228 is connected to the despreader 231, and the output of the despreader 231 is connected to the power measurement circuit 233. Additionally, the AGC amplifier 228 is connected to the combiner 236 through the comparator 239.

A received signal includes a first spread-spectrum signal with power $P_C$ and the other input signals which are considered to be interfering signals with power $P_J$ at the input to the AGC amplifier 228 of FIG. 20. The interfering signal may come from one or more nondesirable signals, noise, multipath signals, and any other source which would serve as an interfering signal to the first spread-spectrum signal. The received signal is normalized by the AGC amplifier 228.

Thus, by way of example, the AGC amplifier 228 can have the power output, $P_C + P_J = 1$. The normalized received signal is despread by the despreader 231 to receive a particular mobile user's signal. The chipping-sequence generator of despreader 231 generates a chip-sequence signal using the same chip sequence as used by the first spread-spectrum signal. Alternatively, the matched filter, if used, of despreader 231 may have an impulse response matched to the same chip sequence as used by the first spread-spectrum signal. The output of the despreader 231 is the normalized power or the first spread-spectrum signal plus the normalized power or the interfering signal divided by the processing gain, PG, of the spread-spectrum system. The power measurement circuit 233 generates a received-power level of the first spread-spectrum signal. The comparator 239 processes the despread-received signal with the AGC-control signal and outputs the power-control signal of the first spread-spectrum signal. The power level of the interfering signal is reduced by the processing gain, PG.

The comparator 239 processes the AGC-control signal with the despread, normalized received signal by multiplying the two signals together, or by logarithmically processing the AGC-control signal with the despread-received signal. In the latter case, the logarithm is taken of the power of the received signal, $P_C + P_J$, and the logarithm is taken of the despread, normalized received signal. The two logarithms are added together to produce the received-power level.

For the present invention to work effectively, the despread signal must be kept nearly constant, independent of variations in the other signals or of obstructions. A preferred implementation to accomplish this end is shown in the circuitry of FIG. 20. FIG. 20 depicts a means for determining at the base station the power of the first spread-spectrum signal when the received signal includes multiple signals and noise. If the circuitry of FIG. 20 were not used, then it is possible that the interfering signal, which may include noise, multipath signals, and other undesirable signals, may raise the power level measured at the input to the receiver of the base station, thereby suppressing the first spread spectrum signal. The undesirable power level measured may cause the remote station to transmit more power than required, increasing the amount of power received at the base station.

As noted earlier, the APC system is a closed loop system. The APC loop operates by generating commands to increase or decrease the transmitter power at the update rate. This is actually quantization process that is done to limit the amount of information that must be fed back to the remote transmitter. The amount of increase or decrease may be fixed in advance or it may adapt in response to the characteristics of the channel as measured locally in the remote terminal, the terminal being controlled. In particular, the remote terminal may examine the sequence of commands received by it. A long sequence of increase commands, for example, implies that the step size may be increased. A typical scheme increases the step size by a fixed amount or a fixed percentage whenever two successive bits are the same. For example, the step size may be increased by 50% if two bits in a row are the same and decreased by 50% if they differ. This is a fairly gross change in the step size, and is intended to be adaptive to local, or immediate in time, variations in the required transmitted power. This process results in a large variation of the step size with time.

An adaptive step size algorithm may also be considered in a different context. Specifically, the step size may be considered to be nearly constant or not responding to localized variations in demanded transmitted power, but the value may be automatically adjusted based on the global characteristics of the channel induced control action. Thus, in a nearly static environment one should use a small constant step size while in a mobile environment the step size should be larger.

Adjustment of the power level of the remote station transmitter may be affected either linearly or nonlinearly. The following algorithm will cause the step size to settle at a nearly optimum constant value. The receiver examines successive APC bits and increases the step size by the factor (1+x) if they agree and decreases the step size by the factor (1+x) if they disagree. Here the parameter x is small (x=0.01, or example). While this procedure will not allow local adaptation (because x is small), it will result in an adaptation to global conditions. Specifically, if the transmitted APC bit stream exhibits a tendency toward successive bits in agreement (i.e., runs of 1's or 0's are-evident) it implies that the system is not following the changes in channel conditions (i.e., the system is slow rate limited) and the step size should be increased. On the other hand, if successive bits tend to be opposite, the system is "hunting" for a value between two values that are excessively far apart. The statistics one expects to observe adds optimal are intermediate to these extremes. That is, the ADC bit stream should appear equally likely to contain the patterns (0,0), (0,1), (1,0), and (1,1) in any pair of successive bits. The above algorithm drives the system behavior toward this.

The above algorithm (global adaptation) works particularly well when the system employs a high update rate relative to the dynamics of the channel.

As illustrated in FIG. 23, to increase the power level using linear adjustment, for example, the transmitter power is increased in regular increments of one volt, or other unit as instructed by the base station, until the power level received at the base station is sufficiently strong. Linear adjustment may be time consuming if the power adjustment necessary were substantial.

As shown in FIG. 22, to increase the power using nonlinear adjustment, the transmitter voltage may be increased, by way of example, geometrically until the transmitted power is in excess of the desired level. Transmitter power may be then reduced geometrically until transmitted power is below the desired level. A preferred approach is to increase the step size voltage by a factor of 1.5 and to decrease the step size by a factor of 0.5. Other nonlinear algorithms may be used. As shown in FIG. 23, this process is repeated, with diminishing margins of error in both excess and insufficiency of desired power, until the desired signal level has been obtained. Nonlinear adjustment provides a significantly faster rise and fall time than does linear adjustment, and may be preferable if power must be adjusted significantly.

The system determines the error state (APC bit) every T seconds, 1/T being the update rate of the control. The update rate may vary from 100 Hz, which is low, to 100 kHz, which is quite high. The opportunity to measure the error state of the system arises with each reception of a new symbol. Thus, the update rate may be equal to the symbol rate. If such an update rate is not supported, it is beneficial to make use of the available error measurements by combining them (or averaging them) between updates. This minimizes the chance of causing a power adjustment in the wrong direction which can occur because of noise in the error signals themselves.

The choice of update rate depends on factors other than APC operation, namely, the amount of capacity and method of allocating capacity to the transport of the APC bits over the channel. In general, a faster update will produce superior performance, even if the increased update rate is obtained by permitting the APC bits to be received in error occasionally. Elaborating, a 1 kHz update rate with no channel induced errors will perform less effectively than a 100 kHz update rate at a 25% rate of errors. This is because of the self correcting behavior of the control loop. A faster update rate eliminates the latency of control which is a key performance limiting phenomenon.

A spread spectrum base station receives all incoming signals simultaneously. Thus, if a signal were received at a higher power level than the others, then that signal's receiver has a higher signal-to-noise ratio and therefore a lower bit error rate. The base station ensures that each mobile station transmits at the correct power level by telling the remote, every 500 microseconds, whether to increase or to decrease the mobile station's power.

FIG. 24 shows a typical fading signal which is received at the base station along with ten other independently fading signals and thermal noise having the same power as one of the signals. Note that the fade duration is about 5 milliseconds which corresponds to vehicular speed exceeding 60 miles per hour. FIGS. 25–26 illustrate the results obtained when using a particular adaptive power control algorithm. In this case, whenever the received signal changes power, the base station informs the remote and the remote varies its power by ±1 dB. FIG. 25 shows the adaptive power control signal at the remote station. FIG. 26 shows the received power at the base station. Note that the adaptive power control track the deep fades and as a result 9 dB fades resulted. This-reduced power level resulted in a bit error rate of $1.4 \times 10^{-2}$.

For the same fade of FIG. 24, assume a different adaptive power control algorithm is employed as shown in FIGS. 27–28. In this case the control voltage results in the remote unit changing its power by a factor of 1.5 in the same direction, or by a factor of 0.5 in the opposite direction. In this particular implementation the minimum step size was 0.25 dB and the maximum step size was 4 dB. Note that the error is usually limited to 0.+−.2 dB with occasional decreases in power by 5 dB to 6 dB resulting in a BER≈$8 \times 10^{-4}$, a significant improvement compared to the previous algorithm. The use of interleaving and forward error correcting codes usually can correct any errors resulting from the rarely observed power dips.

In operation, a mobile station in a cell may transmit the first spread-spectrum signal on a continuous basis or on a repetitive periodic basis. The base station within the cell receives the first spread-spectrum signal. The received first spread-spectrum signal is acquired-and despread with the chip-sequence signal from chip-sequence generator and product device. The despread first spread-spectrum signal is filtered through bandpass filter. The base station detects the despread first spread-spectrum signal using envelope detector, and measures or determines the received-power level of the first spread-spectrum signal. The base station generates the power-command signal from the received-power level.

The present invention also includes a method for automatic-power control of a spread-spectrum transmitter for a mobile station operating in a cellular-communications network using spread-spectrum modulation, with the mobile station transmitting a first spread-spectrum signal. In use, the method includes the step of receiving a received signal, generating an AGC-output signal, despreading the AGC-output signal, processing the despread AGC-output signal to generate a received-power level, generating a power-command signal, transmitting the power-command signal as a second spread-spectrum signal, despreading the power-command signal from the second spread-spectrum signal as a power-adjust signal, and adjusting a power-level of the first spread-spectrum signal.

The received signal includes the first spread-spectrum signal and an interfering signal and is received at the base station. The AGC-output signal is generated at the base station and despread as a despread AGC-output signal. The despread AGC-output signal is processed at the base station to-generate a received-power level.

The received-power level is compared to a threshold, with the comparison used to generate a power-command signal. If the received-power level were greater than the threshold, the power-command signal would command the mobile station to reduce transmitter power. If the received-power level were less than the threshold, the power-command signal would command the mobile station to increase transmitter power.

The power-command signal is transmitted from the base station to the mobile station as a second spread-spectrum signal. Responsive to receiving the second spread-spectrum signal, the mobile station despreads the power-command signal as a power-adjust signal. Depending on whether the power-command signal commanded the mobile station to increase or decrease transmitter power, the mobile station, responsive to the power adjust signal, increases or decreases the transmitter-power level of the first spread-spectrum signal, respectively.

The method may additionally include generating from a received signal an AGC-output signal, and despreading the AGC-output signal. The received signal includes the first spread-spectrum signal and an interfering signal. The received signal is processed with the despread AGC-output signal to generate a received-power level. The method then generates a comparison signal by comparing the received-power level to the threshold level. While transmitting a second spread-spectrum signal, the method adjusts a transmitter-power level of the first spread-spectrum signal from the transmitter using the power-adjust signal.

It will be apparent to those skilled in the art that various modifications can be made to the spread-spectrum system and method of the instant invention without departing from the scope or spirit of the invention, and it is intended that the present-invention cover modifications and variations of the spread-spectrum system and method provided they come within the scope of the appended claims and their equivalents.

What is claimed is:

1. A multipath processor for processing a plurality of groups of spread-spectrum signals, each group having a plurality of spread-spectrum signals, said multipath processor comprising:

first means for despreading a first plurality of spread-spectrum signals within a first group, to generate a first plurality of despread signals, the first spreading means includes a first plurality of correlators for despreading, respectively, the first plurality of spread-spectrum signals, thereby generating the first plurality of despread signals, each correlator of the first plurality of correlators despreads with a chipping-sequence signal having a time delay different from each time delay of each chipping-sequence signal used with other correlators of the first plurality of correlators;

first means for combining the first plurality of despread signals as a first combined-despread signal;

second means for despreading a second plurality of spread-spectrum signals within a second group, to generate a second plurality of despread signals, the second despreading means includes a second plurality of correlators for despreading, respectively, the second plurality of spread-spectrum signals, thereby generating the second plurality of despread signals, each correlator of the second plurality of correlators despreads with a chipping sequence signal having a time delay different from each time delay of each chipping-sequence signal used with other correlators of the second plurality of correlators, and having the time delay different from each time delay of each chipping-sequence signal used with other correlators of the first plurality of correlators;

second means for combining the second plurality of despread signals, as a second combined-despread signal;

means for combining the first combined-despread signal and the second combined-despread signal, as an output-despread signal;

a first plurality and a second plurality of weighting devices, the first plurality of weighting devices for weighting the first plurality of despread signals, and the second plurality of weighting devices for weighting the second plurality of despread signals; and a first and second weighting device, the first weighting device for weighting the first combined-despread signal, and the second weighting device for weighting the second combined despread signal.

2. A multipath processor for processing a plurality of groups of spread-spectrum signals, each group having a plurality of spread-spectrum signals, said multipath processor comprising:

a first plurality of correlators for despreading a first plurality of spread-spectrum signals within a first group, to generate a first plurality of despread signals, each correlator of the first plurality of correlators despreads with a chipping-sequence signal having a time delay different from each time delay of each chipping-sequence signal used with other correlators of the first plurality of correlators;

a first adder for combining the first plurality of despread signals as a first combined-despread signal;

a second plurality of correlators for despreading a second plurality of spread-spectrum signals within a second group, to generate a second plurality of despread signals, each correlator of the second plurality of correlators despread with a chipping-sequence, signal used with other correlators of the second plurality of correlators, and having the time delay different from each time delay of each chipping-sequence signal used with other correlators of the first plurality of correlators;

a second adder for combining the second plurality of despread signals, as a second combined-despread signal;

an output combiner for combining the first combined-despread signal and the second combined-despread signal, as an output-despread signal;

a first plurality and a second plurality of weighting devices, the first plurality of weighting devices for weighting the first plurality of despread signals, and the second plurality of weighting devices for weighting the second plurality of despread signals; and a first and second weighting device, the first weighting device for weighting the first combined-despread signal, and the second weighting device for weighting the second combined despread signal.

3. A multipath processor for processing a plurality of groups of spread-spectrum signals, each group having a plurality of spread-spectrum signals, said multipath processor comprising:

a first plurality of matched filters for despreading a first plurality of spread-spectrum signals within a first group, to generate a first plurality of despread signals, each matched filter of the first plurality of matched filters having an impulse response with a time delay different from each time delay of each impulse response used with other matched filters of the first plurality of matched filters;

a first adder for combining the first plurality of despread signals as a first combined-despread signal;

a second plurality of matched filters for despreading a second plurality of spread-spectrum signals within a second group, to generate a second plurality of despread signals, each matched filter of the second plurality of matched filters having an impulse response with a time delay different from each time delay of each impulse response used with other matched filters of the second plurality of matched filters;

a second adder for combining the second plurality of despread signals, as a second combined-despread signal;

an output combiner for combining the first combined-despread signal and the second combined-despread signal, as an output-despread signal;

a first and a second plurality of weighting devices, the first plurality of weighting devices for weighting the first plurality of despread signals, and the second plurality of weighting devices for weighting the second plurality of despread signals; and a first and second weighting device, the first weighting device for weighting the first combined-despread signal, and the second weighting device for weighting the second combined-despread-signal.

4. A multipath processor for processing a plurality of groups of spread-spectrum signals, each group having a plurality of spread-spectrum signals, said multipath processor comprising:

first means for despreading a first plurality of spread-spectrum signals within a first group, to generate a first plurality of despread signals, the first despreading means includes a first plurality of matched filters for despeading, respectively, the first plurality of spread-spectrum signals, thereby generating the first plurality of despread signals;

first means for combining the first plurality of despread signals as a first combined-despread signal;

second means for despreading a second plurality of spread-spectrum signals within a second group, to generate a second plurality of despread signals, the second despreading means includes a second plurality of matched filters for despreading, respectively, the second plurality of spread-spectrum signals, thereby generating the second plurality of despread signals;

second means for combining the second plurality of despread signals, as a second combined-despread signal;

means for combining the first combined-despread signal and the second combined-despread signal, as an output-despread signal a first and second plurality of weighting devices, the first plurality of weighting devices for weighting the first plurality of despread signals, and the second plurality of weighting devices for weighting the second plurality of despread signals; and a first and second weighting device, the first weighting device for weighting the first combined-despread signal, and the second weighting device for weighting the second combined despread signal.

* * * * *

UNITED STATES PATENT AND TRADEMARK OFFICE
CERTIFICATE OF CORRECTION

PATENT NO. : 6,611,548 B2
DATED : August 26, 2003
INVENTOR(S) : Gary R. Lomp

It is certified that error appears in the above-identified patent and that said Letters Patent is hereby corrected as shown below:

Column 4,
Line 62, after the word "devices", delete "403, 404,405,406" and insert therefor -- 403,404,405, 406 --.

Column 5,
Line 9, after the phrase "second chipping-sequence signal", delete "$g(t-2T_o)$", and insert therefor -- $g(t-T_o)$ --.
Line 56, after the phrase "by time", delete "$T_{D1}$" and insert therefor -- $T_{D1},$ --.

Column 6,
Line 10, after the phrase "fifth weighting", delete "device," and insert therefor -- device --.
Line 31, after the symbol "$h_n,$" insert -- $h_{n+}$ --.
Lines 44-46, delete the entire phrase "where $a_i$ represents...the communications channel" which is an erroneous repeat of the phrase included on lines 41-43.

Column 7,
Line 56, delete "$g_{p(}t)$", and insert therefor -- $g_p(t)$ --.

Column 11,
Line 36, delete "The-step" and insert therefor -- The step --.

Column 14,
Line 16, after the word "adequate", delete "for," and insert therefor -- for --.

Column 19,
Line 7, after the word "be", delete "affected" and insert therefor -- effected --.

Column 20,
Line 41, after the word "to", delete "0.+-.2 dB" and insert therefor -- +-0.2 dB --.

UNITED STATES PATENT AND TRADEMARK OFFICE
CERTIFICATE OF CORRECTION

PATENT NO. : 6,611,548 B2
DATED : August 26, 2003
INVENTOR(S) : Gary R. Lomp

It is certified that error appears in the above-identified patent and that said Letters Patent is hereby corrected as shown below:

Column 24,
Line 12, delete "despeading" and insert therefor -- despreading -- .
Line 31, after the word "signal", insert -- ; --

Signed and Sealed this

Twenty-second Day of June, 2004

JON W. DUDAS
*Acting Director of the United States Patent and Trademark Office*